US011289796B2

(12) United States Patent
Vollmer et al.

(10) Patent No.: US 11,289,796 B2
(45) Date of Patent: Mar. 29, 2022

(54) CIRCUIT BOARD ARRANGEMENT FOR SIGNAL SUPPLY TO A RADIATOR

(71) Applicant: Telefonaktiebolaget LM Ericsson (publ), Stockholm (SE)

(72) Inventors: Andreas Vollmer, Rosenheim (DE); Dan Fleancu, Griesstätt (DE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 555 days.

(21) Appl. No.: 16/307,442

(22) PCT Filed: Jun. 6, 2017

(86) PCT No.: PCT/EP2017/000656
§ 371 (c)(1),
(2) Date: Dec. 5, 2018

(87) PCT Pub. No.: WO2017/211451
PCT Pub. Date: Dec. 14, 2017

(65) Prior Publication Data
US 2019/0221918 A1    Jul. 18, 2019

(30) Foreign Application Priority Data
Jun. 6, 2016 (DE) ............... 10 2016 007 052.8

(51) Int. Cl.
*H01Q 1/24* (2006.01)
*H01Q 21/06* (2006.01)
(Continued)

(52) U.S. Cl.
CPC ............ *H01Q 1/243* (2013.01); *H01P 5/085* (2013.01); *H01P 5/12* (2013.01); *H01Q 1/24* (2013.01);
(Continued)

(58) Field of Classification Search
None
See application file for complete search history.

(56) References Cited

U.S. PATENT DOCUMENTS 4,494,083 A   1/1985 Josefsson et al.
4,837,529 A * 6/1989 Gawronski ............ H01P 5/085
                                                333/260
(Continued)

FOREIGN PATENT DOCUMENTS

CN         1937319 A    3/2007
CN       102623795 A    8/2012
(Continued)

OTHER PUBLICATIONS

Leib, M. et al., "In-Phase and Anti-Phase Power Dividers for UWB Differentially Fed Antenna Arrays," IEEE Antennas and Wireless Propagation Letters, vol. 9. May 18, 2010, 4 pages.
(Continued)

*Primary Examiner* — Vibol Tan
(74) *Attorney, Agent, or Firm* — Withrow & Terranova, PLLC

(57) ABSTRACT

The present invention relates to a circuit board arrangement including a circuit board, whose metallization comprises at least one coplanar stripline for supplying signals to a radiator, in particular a mobile communication radiator. In this circuit board arrangement, the circuit board comprises a field converter, which is electrically connected to the coplanar stripline and which conducts a coaxial field through at least one layer of the circuit board and converts it into the coplanar stripline field of the coplanar stripline.

18 Claims, 16 Drawing Sheets

(51) Int. Cl.
*H01Q 9/06* (2006.01)
*H01Q 1/38* (2006.01)
*H01P 5/08* (2006.01)
*H01P 5/12* (2006.01)
*H05K 1/02* (2006.01)
*H01Q 19/10* (2006.01)
*H04W 88/04* (2009.01)
*H05K 1/11* (2006.01)
*H01Q 21/00* (2006.01)

(52) U.S. Cl.
CPC .............. *H01Q 1/38* (2013.01); *H01Q 9/065* (2013.01); *H01Q 19/108* (2013.01); *H01Q 21/062* (2013.01); *H01Q 21/064* (2013.01); *H04W 88/04* (2013.01); *H05K 1/0221* (2013.01); *H05K 1/0251* (2013.01); *H01Q 21/0075* (2013.01); *H05K 1/0245* (2013.01); *H05K 1/115* (2013.01)

(56) References Cited

U.S. PATENT DOCUMENTS

| | | | | |
|---|---|---|---|---|
| 5,886,590 | A * | 3/1999 | Quan | H01P 5/085 333/33 |
| 5,963,111 | A * | 10/1999 | Anderson | H01P 5/085 333/128 |
| 6,025,803 | A * | 2/2000 | Bergen | H01Q 1/246 343/700 MS |
| 6,992,629 | B2 | 1/2006 | Kerner et al. | |
| 7,619,574 | B1 * | 11/2009 | West | H01Q 1/286 343/700 MS |
| 8,350,771 | B1 * | 1/2013 | Zaghloul | H01Q 5/40 343/769 |
| 9,054,403 | B2 * | 6/2015 | Blanton | H01P 5/02 |
| 2004/0027308 | A1 | 2/2004 | Lynch et al. | |
| 2007/0229361 | A1 | 10/2007 | Yanagi et al. | |
| 2009/0009399 | A1 | 1/2009 | Gaucher et al. | |
| 2009/0212881 | A1 | 8/2009 | Snodgrass et al. | |
| 2010/0284140 | A1 | 11/2010 | Corisis et al. | |
| 2011/0043424 | A1 * | 2/2011 | Lee | H01Q 9/285 343/816 |
| 2015/0268336 | A1 | 9/2015 | Yukumatsu et al. | |
| 2015/0319860 | A1 | 11/2015 | Corisis et al. | |

FOREIGN PATENT DOCUMENTS

| | | | |
|---|---|---|---|
| CN | 204348905 | U | 5/2015 |
| CN | 105024126 | A | 11/2015 |
| DE | 602004008653 | T2 | 6/2008 |
| DE | 102012201282 | A1 | 8/2012 |
| EP | 2262058 | A1 | 12/2010 |
| JP | 2000241780 | A | 9/2000 |
| JP | 2006258762 | A | 9/2006 |
| JP | 2011004355 | A | 1/2011 |
| JP | 2012159349 | A | 8/2012 |
| RU | 15150 | U1 | 9/2000 |
| WO | 2011125417 | A1 | 10/2011 |

OTHER PUBLICATIONS

ISA European Patent Office, International Search Report Issued in Application No. PCT/EP2017/000656, dated Aug. 18, 2017, WIPO, 6 pages.
Ye, S. et al., "High Gain Planar Antenna Arrays for Mobile Satellite Communications," IEEE Antennas and Propagation Magazine, vol. 54, No. 6, Dec. 24, 2012, 9 pages.
Search Report for Chinese Patent Application No. 2017800351103, dated Aug. 12, 2020, 2 pages.
First Office Action for Chinese Patent Application No. 2017800351103, dated Aug. 24, 2020, 24 pages.
Examination Report for European Patent Application No. 17729775.1, dated Feb. 28, 2020, 18 pages.
Written Opinion for International Patent Application No. PCT/EP2017/000656, dated Aug. 18, 2017, 17 pages.
Second Office Action for Chinese Patent Application No. 201780035110.3, dated Apr. 20, 2021, 23 pages.
Examination Report for European Patent Application No. 17729775.1, dated Feb. 1, 2021, 11 pages.
Notice of Reasons for Refusal and Search Report for Japanese Patent Application No. 2019-516056, dated May 21, 2021, 86 pages.
Result of Consultation for European Patent Application No. 17729775.1, dated Sep. 13, 2021, 14 pages.

* cited by examiner

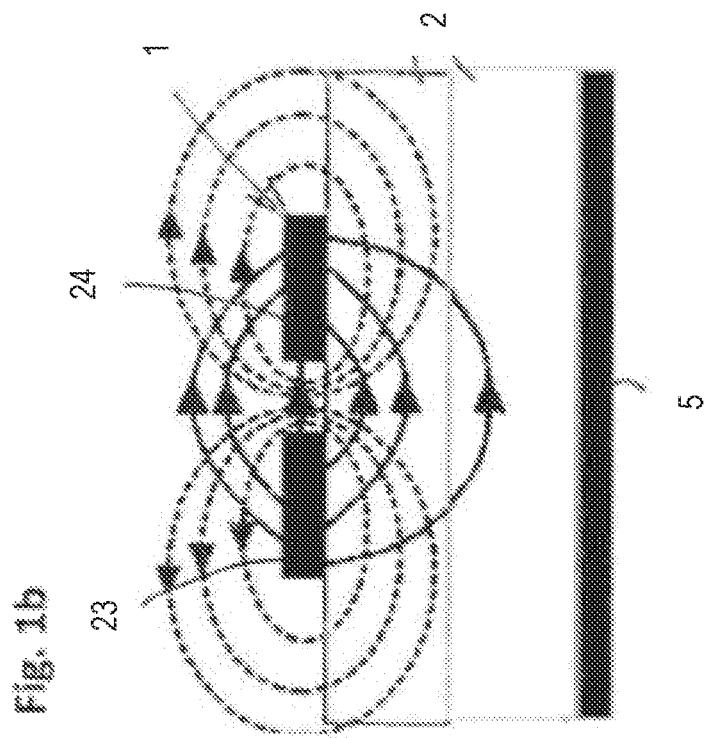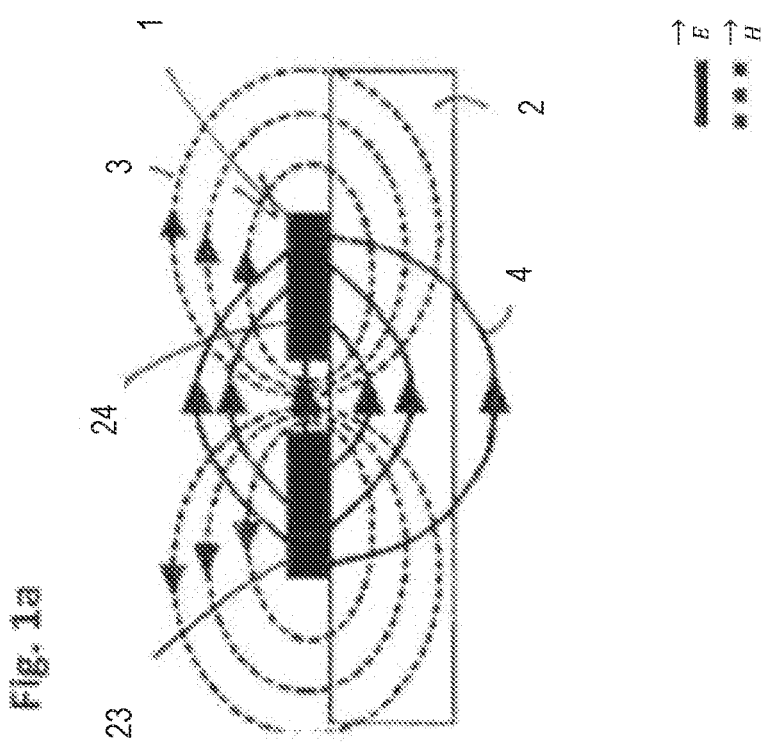

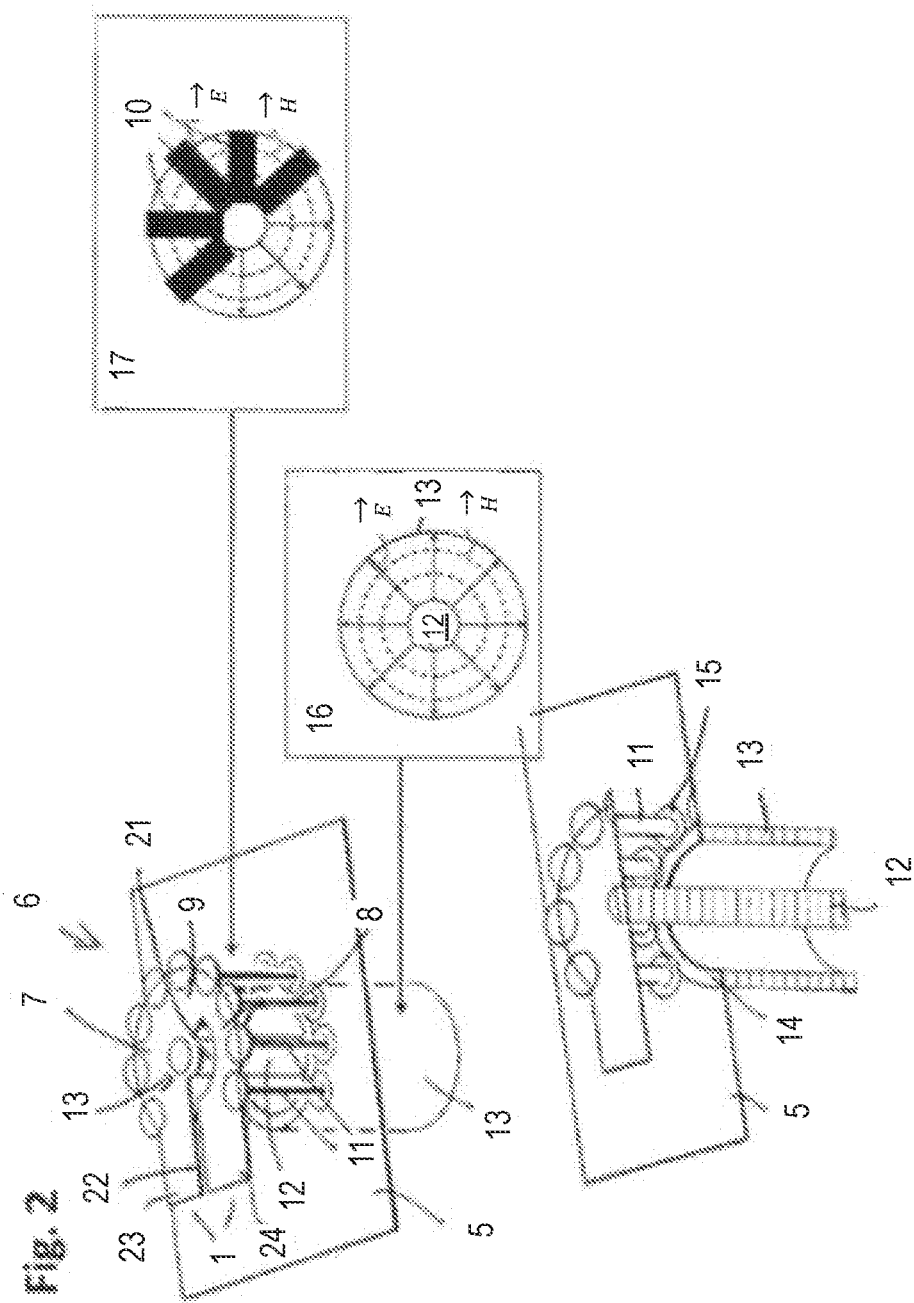

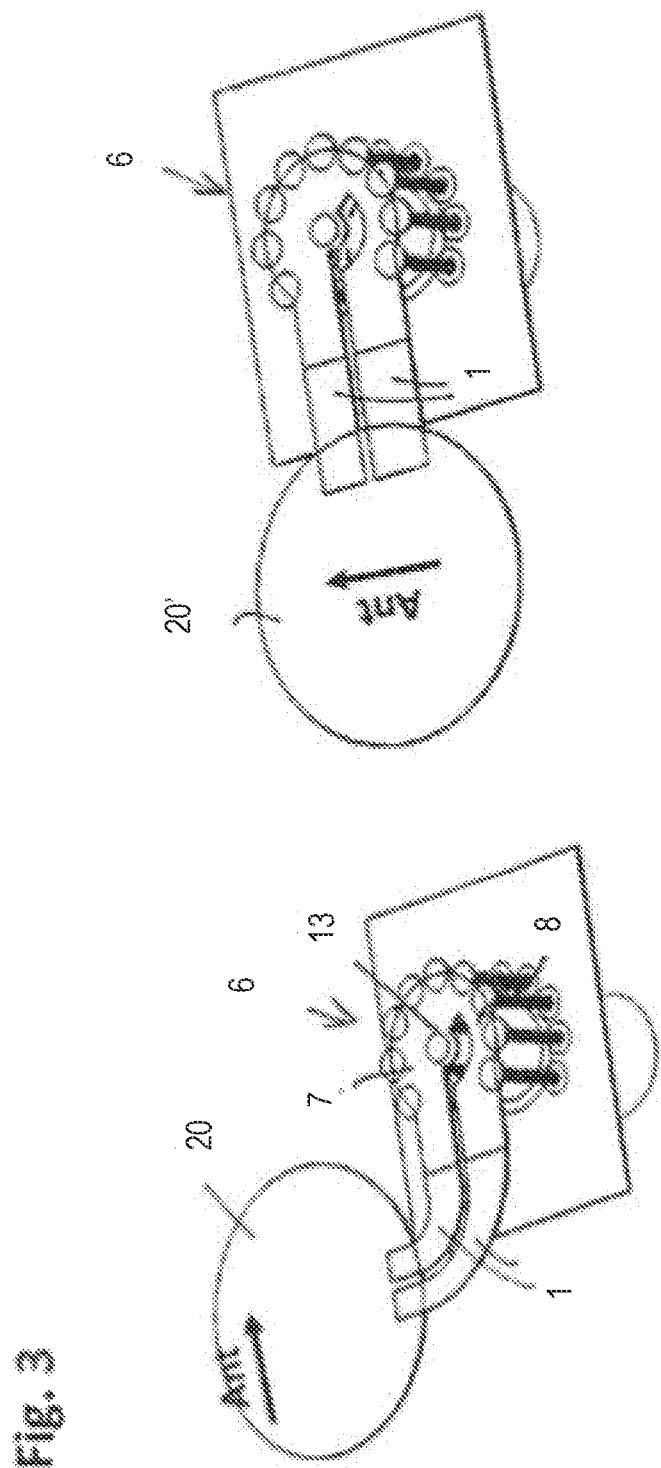

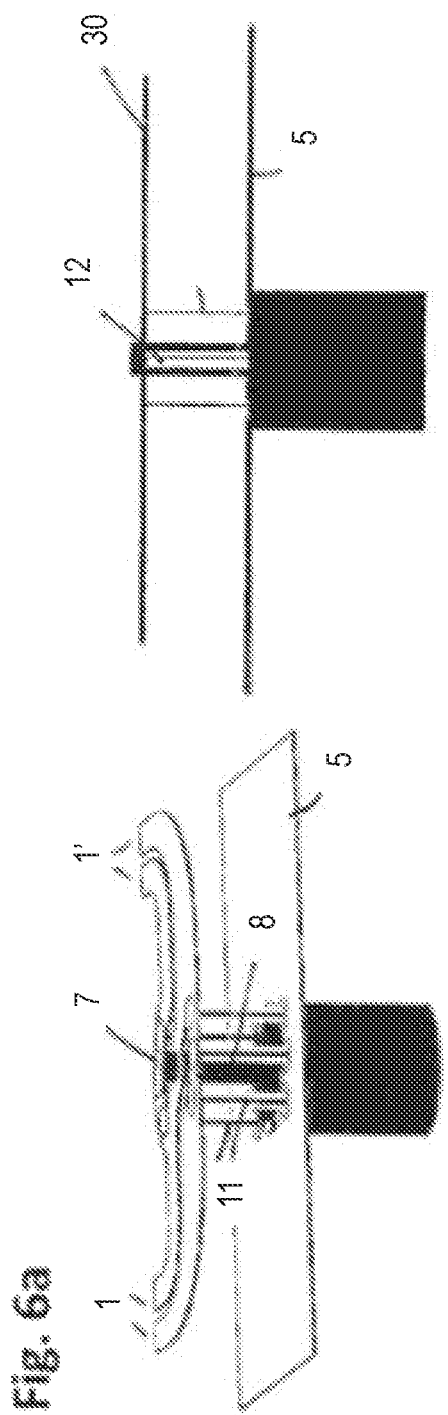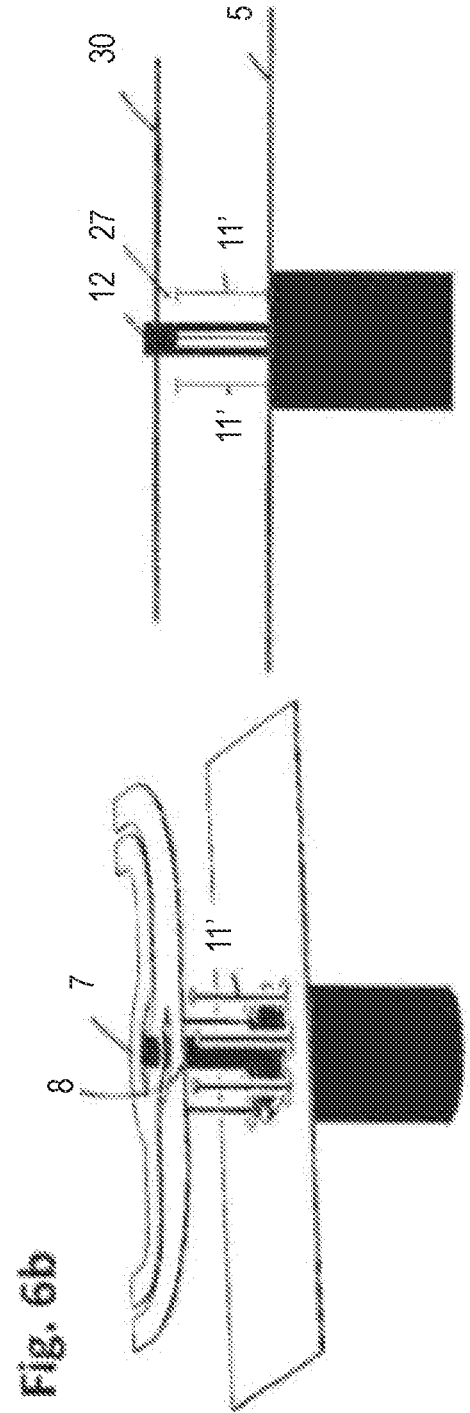

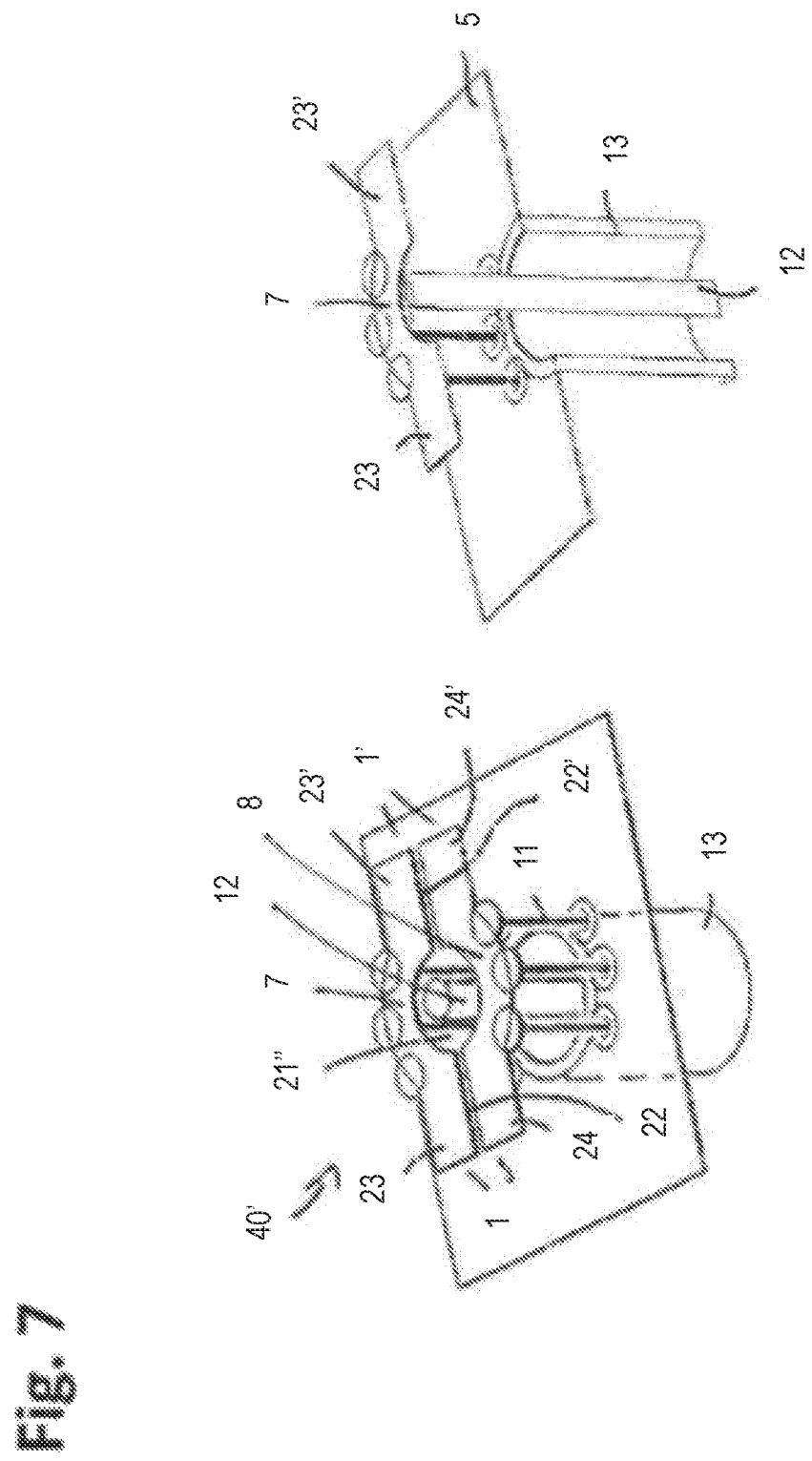

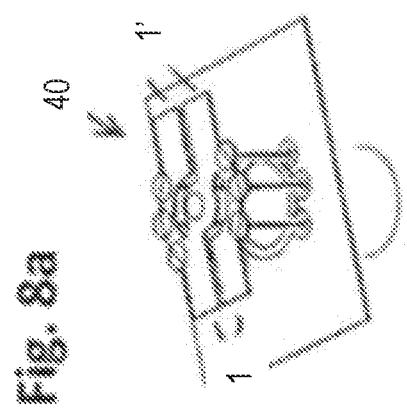
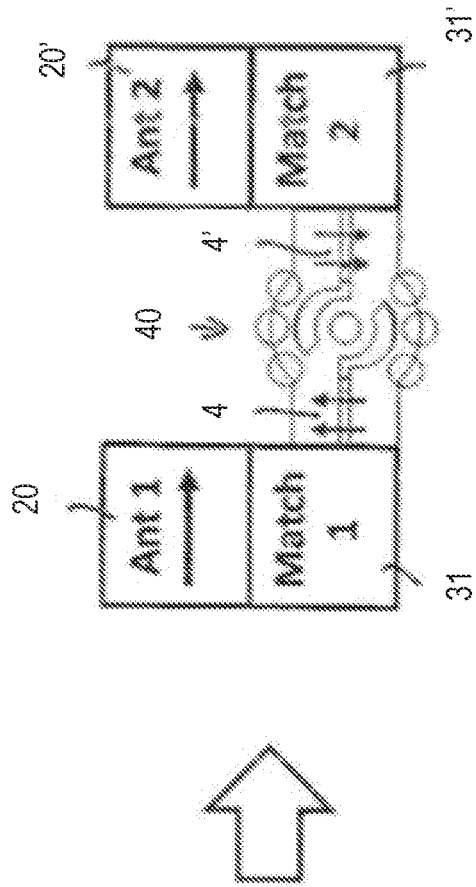
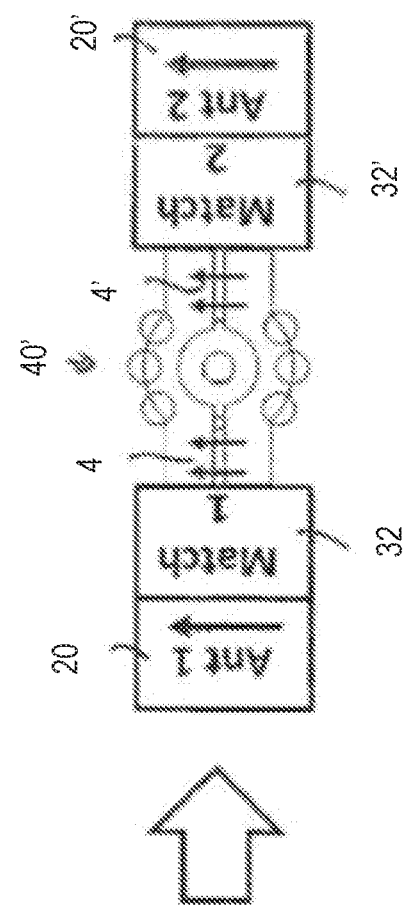
Fig. 8a
Fig. 8b

CIRCUIT BOARD ARRANGEMENT FOR SIGNAL SUPPLY TO A RADIATOR

CROSS-REFERENCE TO RELATED APPLICATION

The present application is a U.S. National Phase of International Patent Application Serial No. PCT/EP2017/000656, entitled "CIRCUIT BOARD ARRANGEMENT FOR SIGNAL SUPPLY TO A RADIATOR," filed on Jun. 6, 2017. International Patent Application Serial No. PCT/EP2017/000656 claims priority to German Patent Application No. 10 2016 007 052.8, filed Jun. 6, 2016. The entire contents of each of the abovementioned applications are hereby incorporated by reference in their entirety for all purposes.

TECHNICAL FIELD

The present invention relates to a circuit board arrangement including a circuit board, whose metallization comprises at least one coplanar stripline for supplying signals to a radiator. In addition, the present invention relates to a circuit board arrangement including a circuit board, whose metallization comprises a radiator in at least a first metallization plane. The respective radiator is in particular a mobile communication radiator.

BACKGROUND AND SUMMARY

According to a possible case of use, the present invention especially relates to a circuit board arrangement, in which the radiator is defined by the metallization of the circuit board of the circuit board arrangement, so that the radiator is a circuit board radiator. In the field of mobile communications, it is known to use circuit board radiators. In the case of such circuit board radiators, the signal lines, which supply the radiator with mobile radio signals, as well as the radiator itself are normally defined by sections of the metallization of the circuit board. The signal lines used are in most cases microstriplines.

The article "In-phase and anti-phase power dividers for UWB differentially fed antenna arrays", Mario Leib et al., IEEE antennas and wireless propagation letters, volume 9, 2010, page 455, describes a circuit board arrangement for use in the field of radar technology. There, coplanar striplines are used for supplying two circuit board radiators with signals. In addition, the circuit board arrangement comprises a power divider, which is defined by the transition between a microstripline and the coplanar striplines and which supplies two circuit board antennas in parallel with signals of the microstripline.

It is the object of the present invention to provide an improved circuit board arrangement.

According to the present invention, this object is achieved by the circuit board arrangements according to claims 1 and 11. Preferred embodiments of the present invention are the subject matters of the subclaims.

According to a first aspect, the present invention comprises a circuit board arrangement including a circuit board, whose metallization comprises at least one coplanar stripline for supplying signals to a radiator. According to the present invention, the circuit board comprises a field converter, which is electrically connected to the coplanar stripline and conducts a coaxial field through at least one layer of the circuit board and converts it into the coplanar stripline field of the coplanar stripline. The field converter according to the present invention allows an extremely compact structural design of the circuit board arrangement and enhances the possibilities of use of the latter.

Such a circuit board arrangement can be used especially in the field of mobile communications, so that the radiator supplied by the coplanar strip line of the circuit board arrangement is a mobile communication radiator. In possible cases of use of the present invention, the radiator can be used as an antenna of a base station. Alternatively, it is, however, also imaginable to use the radiator as an antenna of a repeater or as an antenna of a mobile radio terminal, in particular as an antenna of a mobile phone.

The field converter conducts the coaxial field preferably at least through a dielectric layer of the circuit board. According to a possible embodiment, the field converter may conduct the coaxial field, alternatively or additionally, through a metallization plane of the circuit board. Particularly preferred, the field converter conducts the coaxial field at least through a metallization plane and two adjoining dielectric layers of the circuit board.

Preferably, the field converter conducts the coaxial field through the at least one layer of the circuit board perpendicularly to the direction in which the circuit board extends.

The coplanar striplines used according to the present invention are preferably defined by two conductor paths of the circuit board arrangement, which are formed in a metallization plane and separated from one another by a slot. The coplanar stripline field is here preferably a differential line field, which is transmitted by the two conductor paths.

According to a first embodiment, the circuit board is free of metallization in the area of the conductor paths in other planes. According to a second embodiment, however, a ground plane, which is formed e.g. by a further metallization plane of the circuit board arrangement, may be provided below the conductor paths defining the coplanar stripline. Such embodiments are sometimes also referred to as quasi-coplanar stripline, and also represent a coplanar stripline within the meaning of the present invention.

In a first embodiment, the field converter according to the present invention may be used for supplying a single radiator with signals. In such a case of use, a single coplanar stripline extends from the field converter to the radiator.

In a second embodiment, the field converter according to the present invention defines a power divider for electrically connecting two radiators to a signal line. Hence, the field converter has not only the function of conducting the coaxial field through the circuit board and converting it into a coplanar stripline field, but also the function of connecting two radiators in parallel. Such two radiators connected in parallel are sometimes also referred to as "double block".

For this purpose, the circuit board preferably has at least two coplanar striplines for electrically connecting a respective one of the radiators, the field converter being electrically connected to both coplanar striplines and conducting a coaxial field through at least one layer of the circuit board and converting and dividing the coplanar stripline fields of the two coplanar striplines. The two coplanar striplines are preferably formed in the same metallization plane of the circuit board.

If the field converter is used as a power divider, the two radiators will preferably be arranged in parallel and connected to the field converter such that the radiators radiate in phase. This allows parallel operation of the two radiators and a constructive superposition of the antenna diagrams of the two radiators.

According to a first variant of the present invention, the field converter can convert and divide the coaxial field into two opposite-phase coplanar stripline fields. In this case, the two coplanar striplines preferably generate an in-phase field at the radiators by different changes of direction. In particular, this will allow the two radiators to radiate in phase.

According to a second variant, the field converter can convert and divide the coaxial field into two in-phase coplanar stripline fields. In this case, the two coplanar striplines preferably generate an in-phase field at the radiators by no change of direction or identical changes of direction. Also this will allow the two radiators to radiate in phase.

According to a possible embodiment of the present invention, the radiator or radiators may form separate elements with respect to the circuit board and may e.g. be attached to the circuit board. In this case, the circuit board only provides for signal conduction to the radiators.

According to a preferred embodiment of the present invention, the radiator or radiators is/are formed by a metallization of the circuit board. This allows a particularly compact structural design of the circuit board arrangement, in which the coplanar striplines as well as the radiators are formed by a metallization of the circuit board.

According to a possible embodiment, the coplanar striplines and the radiator or radiators may extend in different planes of the circuit board and may especially be formed by different metallization planes.

According to a preferred embodiment of the present invention, the radiator or radiators is/are arranged in the same plane of the circuit board as the coplanar striplines and/or formed in the same metallization plane of the circuit board.

According to a preferred embodiment of the present invention, the field converter comprises vias and/or metallization sections of the circuit board. In particular, the vias allow the coaxial field to be conducted through at least one layer of the circuit board. The metallization sections of the circuit board preferably provide for the field conversion and/or the connection to the coplanar stripline.

According to a possible embodiment of the present invention, the field converter is formed by vias and/or metallization sections of the circuit board. In this kind of embodiment, the field converter may in particular be integrated completely in the circuit board and/or formed by components of the circuit board.

According to an alternative embodiment, the field converter may, however, comprise not only metallization sections of the circuit board but also the end of a coaxial cable. The end of the coaxial cable may be used either in addition to the vias or instead of the vias.

According to a possible embodiment of the present invention, the field converter comprises a coaxial line section, which conducts the coaxial field through at least one layer of the circuit board, and a coplanar conversion section. The coaxial line section is preferably routed onto the plane of the coplanar conversion section of the field converter and/or is electrically contacted with the coaxial line section. Through the combined effect of the coaxial line section and the coplanar conversion section, the coaxial field conducted through the at least one layer of the circuit board is converted into a coplanar line field. Electrical contacting between the two sections may be effected galvanically and/or capacitively.

Preferably, the coplanar conversion section of the field converter is defined by metallization sections of the circuit board. In particular, the coplanar conversion section may merge into at least one coplanar stripline and, preferably, it is formed in the same metallization plane of the circuit board as the coplanar stripline or the coplanar striplines.

According to a possible embodiment, a plurality of vias may be provided, the vias defining an outer conductor of the coaxial line section of the field converter. The vias are preferably in electrical contact with the coplanar conversion section. The electric connection may be effected galvanically and/or capacitively.

Alternatively or additionally, the inner conductor of the coaxial line section may be defined by the inner conductor of a coaxial cable and/or a via. If the field converter is fully integrated in the circuit board, a via will preferably be used. If the field converter is also used for connecting a coaxial cable, the inner conductor of the coaxial line section will preferably be formed either by the inner conductor of the coaxial cable or by a combination of the inner conductor of the coaxial cable and a via, e.g. by inserting the inner conductor of the coaxial cable into a hole of the via and/or by passing it through the via.

According to a preferred embodiment of the present invention, the coplanar conversion section of the field converter comprises two outer conductor paths connected to the outer conductor of the coaxial line section of the field converter in areas located opposite to each other, when seen relative to the inner conductor. Each of the two outer conductor paths preferably merges into at least one respective path of a coplanar stripline.

If the circuit board has two coplanar striplines, the two coplanar striplines are connected to the coplanar conversion section of the field converter preferably on opposite sides. Furthermore, the at least one conductor path of the respective coplanar stripline may merge into an outer conductor path of the field converter.

According to a first embodiment, the coplanar conversion section of the field converter may comprise a diagonal path, which diagonally connects opposite conductor paths of the two coplanar striplines. Preferably, the diagonal path is connected to the inner conductor of the coaxial line section of the field converter. The diagonal path thus ensures that the coaxial field is divided into two opposite-phase coplanar stripline fields.

Preferably, the outer conductor paths couple capacitively or galvanically to the diagonal path section on opposite sides. This coupling leads to a field separation, through which the coaxial field is transferred to the respective coplanar stripline.

According to a second embodiment, the two outer conductor paths each merge on either side thereof into a conductor path of the respective coplanar stripline. In particular, the conductor paths of the two coplanar striplines may in this case be connected to one another through the two outer conductor paths in the area of the field converter.

The outer conductor paths may here form an expansion of the coplanar stripline, guided around the area of the inner conductor of the coaxial line section. Preferably, there is no connection between the inner conductor of the coaxial line section of the field converter and a metallization section of the coplanar striplines. In this embodiment, an in-phase division of the coaxial field into two coplanar stripline fields is effected.

The present invention may also be used in the event that the circuit board comprises only one coplanar stripline, which is connected to the coplanar conversion section of the field converter on one side thereof. This will especially be the case when the field converter is not used as a power divider, but is only used for feeding a single radiator.

In this case, the two outer conductor paths preferably merge into a respective path of the coplanar stripline and are connected to one another on the opposite side. The two outer conductor paths thus form a short circuit of the two paths of the coplanar striplines. Preferably, the coplanar conversion section of the field converter additionally comprises an end face, which connects one of the outer conductor sections to the inner conductor. In this way, the coaxial field is blocked in this area and transferred to the coplanar stripline as a coplanar stripline field.

Irrespectively of the concrete structural design, the slot provided between the two conductor paths of a coplanar stripline is preferably extended up to and into the area of the coplanar conversion section. In particular, the slot extends into an area of the coplanar conversion section, which, in projection, lies between the inner conductor and the outer conductor of the coaxial line section of the field converter. Preferably, the slot extends around the inner conductor over a certain distance. Preferably, the slot is routed partially around the inner conductor on a curved path in the area of the coplanar conversion section. The slot may have a larger width in the area of the coplanar conversion section than in the area of the coplanar stripline.

In the first embodiment of the present invention, the field converter also serves as a connection for a coaxial cable. In particular, the coaxial cable may be connected to the circuit board transversely to the plane of the circuit board and, in particular, vertically to the plane of the circuit board. Preferably, the coaxial field is conducted to the field converter through the coaxial cable.

Preferably, the inner conductor of the coaxial cable defines, in such an embodiment, the inner conductor of the coaxial line section of the field converter or is in electrical contact therewith. In particular, the inner conductor may be routed to the plane of the coplanar conversion section of the field converter and/or may be in electrical contact therewith.

Preferably, the outer conductor of the coaxial cable may define the outer conductor of the coaxial line section of the field converter or may be in electrical contact therewith.

According to a possible embodiment, the inner conductor of the coaxial cable may be routed through at least one layer of the circuit board onto the plane of the coplanar conversion section of the field converter and/or may be in electrical contact therewith.

Alternatively or additionally, the outer conductor of the coaxial cable may be in electrical contact with one or a plurality of vias defining an outer conductor of the coaxial line section of the field converter. Alternatively, the use of vias may also be dispensed with, and the outer conductor of the coaxial cable may be routed through at least one layer of the circuit board onto the plane of the coplanar conversion section of the field converter, and/or may be in electrical contact therewith. Electrical contacting may be effected galvanically or capacitively.

In an alternative embodiment of the circuit board arrangement according to the present invention, the circuit board is a multilayer circuit board, the field converter being used for establishing a signal connection between two planes of the circuit board.

Furthermore, the coplanar stripline may be arranged in a first metallization plane of the circuit board, the circuit board comprising in a second or third metallization plane a stripline, which is electrically connected to the coplanar stripline via the field converter through at least one layer of the circuit board.

The multilayer circuit board may comprise at least two metallization planes, e.g. one on the upper surface and one on the lower surface thereof. However, embodiments are also imaginable, in the case of which the multilayer circuit board comprises more than two metallization planes.

The stripline arranged in the second or third metallization plane of the circuit board may be a microstripline according to a possible embodiment. Alternatively, the use of a coplanar stripline is, however, imaginable also in this case.

According to a possible embodiment of the present invention, the field converter may comprise a coplanar conversion section in a first metallization plane of the circuit board and a stripline section in a second or third metallization plane of the circuit board, the field converter additionally comprising a coaxial line section connecting the coplanar conversion section through at least one layer of the circuit board to a stripline section. The stripline section also serves as a conversion section for converting a stripline field into the coaxial field of the coaxial line section. In a possible embodiment, the stripline section may be configured as a coplanar conversion section. Alternatively, the stripline section may be configured as a microstrip conversion section.

In a possible embodiment of the present invention, a second metallization plane of the circuit board may be provided between the first metallization plane of the coplanar conversion section and the third metallization plane of the stripline section, the second metallization plane being preferably used as a ground plane. In particular when the stripline section is a microstripline section, the ground plane may serve as a ground plane of the microstripline. In this case, the coaxial line section of the field converter preferably conducts the coaxial field through the second metallization plane.

Preferably, vias are provided, which connect the second and/or third metallization plane to the first metallization plane having the radiator arranged therein and which define the outer conductor of the coaxial line section of the field converter. The second metallization plane may here serve as a ground plane and may have a circular cutout in the area of the field converter. Preferably, the vias are arranged on the circumference of such a circular cutout of the second metallization plane. The vias extend preferably from the first metallization plane via the second metallization plane to the third metallization plane.

If, as described above, the field converter according to the present invention serves to internally connect two metallization planes of the circuit board arrangement according to the present invention, this will be advantageous insofar as the line sections can be routed independently of the arrangement of the radiators on the circuit board. In particular, it will thus also be possible to pass the line sections through the area in which the radiator is provided in some other plane.

Normally, prior art circuit board radiators are used together with an external reflector, the radiator arranged on the circuit board being normally arranged at a distance of approx. $\lambda/2$ or $\lambda/4$ from the external reflector. In this way, the directivity of the field emitted by the radiator is influenced. Such a structural design, in which an external reflector is used for the radiator according to the present invention, is also imaginable for use with the present invention in cases where the radiator is integrated in the circuit board as well as in cases where the radiator defines a component separate from the circuit board.

According to a particularly preferred embodiment of the present invention, the reflector of the radiator is, however, defined by a second metallization plane of the circuit board. This aspect is also part of the subject matter of the present invention independently of the above described first aspect, especially in cases where the radiator is integrated in the circuit board.

Hence, the present invention comprises, according to a second aspect, a circuit board arrangement including a circuit board, whose metallization comprises a radiator in at least a first metallization plane. According to the present invention, the reflector of the radiator is here defined by a second metallization plane of the circuit board. Preferably, the radiator is here again a mobile communication radiator.

It follows that, by means of its metallizations in different planes, the circuit board according to the present invention thus forms the radiator as well as the reflector for the radiator. In this way, an enormously compact structural design is obtained.

In the case of the circuit board arrangement disclosed by the present invention according to the second aspect of the present invention, the distance between the first metallization plane and the second metallization plane is preferably between $0.1\lambda$ and $0.7\lambda$, in particular between $0.15\lambda$ and $0.35\lambda$ or between $0.4\lambda$ and $0.6\lambda$. $\lambda$ is here the wavelength of the center frequency of the lowermost resonant frequency range of the antenna according to the present invention, and/or the wavelength of the center frequency of the frequency band for which the antenna is used. The wavelength in the dielectric of the circuit board should here be taken as a basis.

The circuit board preferably comprises between the first metallization plane, in which the radiator is formed, and the second metallization plane, in which a reflector is formed, at least one dielectric layer. In possible embodiments, also a plurality of dielectric layers may, however, be provided. Preferably, the first metallization plane, the second metallization plane and the intermediate dielectric layers are laminated together. The circuit board thus forms an integral multilayer arrangement.

However, it is also imaginable to construct such a circuit board making use of two separate circuit board layers, which each comprise a metallization plane and at least one dielectric layer, the two dielectric layers being placed one on top of the other and optionally connected to one another.

The metallization plane defining the reflector of the radiator disclosed by the present invention according to the second aspect may be configured as a ground plane.

The first and the second metallization planes may be arbitrary metallization planes of the multilayer circuit board, which may be arranged within the layer structure of the circuit board in an arbitrary manner. According to a possible embodiment, the first and/or the second metallization plane may be an outer metallization plane of the circuit board, in particular an upper or a lower metallization plane. In other embodiments, the first and/or the second metallization plane may be an inner metallization plane of the circuit board. Furthermore, one or a plurality of additional metallization planes may be provided below and/or above the first and/or the second metallization plane.

In addition, the radiator may, according to the second aspect, be supplied by a stripline extending in a third metallization plane of the circuit board. In particular, the second metallization plane defining the reflector may extend between the third metallization plane, which defines the stripline, and the first metallization plane of the radiator. This, in turn, allows to place the stripline, which supplies signals to the radiator, on the circuit board independently of the arrangement of the radiator. In this case, the stripline may possibly also extend in the area in which the radiator is arranged. The stripline used may here be e.g. a microstripline. In this case, the second metallization plane defining the reflector is preferably used as a ground plane for the microstripline. Alternatively, the stripline may, however, also be configured as a coplanar stripline.

Furthermore, the radiator and the stripline may, according to the second aspect of the present invention, be electrically connected by means of a field converter through a layer of the circuit board. Preferably, the field converter conducts a coaxial field through at least one layer of the circuit board. Alternatively or additionally, the metallization of the circuit board may comprise at least one coplanar stripline for supplying signals to the radiator. Preferably, this coplanar stripline is arranged in the first metallization plane, which comprises the radiator.

As has already been described above, the second aspect may be used independently of the first aspect of the present invention. Preferably, the second aspect of the present invention is, however, combined with the first aspect of the present invention.

In particular, a field converter of the type described hereinbefore in more detail is used for supplying signals to the radiator according to the second aspect. In this case, in particular a field converter according to the present invention of the type described hereinbefore may conduct the coaxial field through the second metallization plane.

In this case, vias are preferably provided, which connect the second metallization plane of the reflector to the first metallization plane having the radiator arranged therein and which form part of the outer conductor of the coaxial line section of the field converter. The second metallization plane may here serve as a ground plane and comprise a circular cutout in the area of the field converter. Preferably, the vias are here arranged on the circumference of such a circular cutout of the ground plane.

If the field converter is also used for connecting a coaxial cable, the outer conductor will preferably be connected, in particular galvanically connected, to the ground plane.

If the field converter is, however, used for internally conducting signals from one plane to another plane of the circuit board, the vias will preferably be provided between the two planes of the circuit board between which the signals are to be conducted. In particular, the vias may extend from the first metallization plane having the radiator arranged therein to the second metallization plane of the circuit board, which defines the reflector, and from there to a third metallization plane of the circuit board having preferably provided therein a stripline which feeds the radiator.

Preferred embodiments, which are adapted to be used for the first as well as for the second aspect of the present invention as well as for a combination of these two aspects, will be described in more detail in the following:

Preferably, the radiator or the radiators, which is/are defined by a metallization plane of the circuit board according to the present invention, is/are surrounded by a frame defined by vias. Alternatively or additionally, the frame may comprise metallization sections. Preferably, the frame comprises a frame-shaped metallization section, which, further preferred, is electrically coupled, in particular galvanically coupled, to the vias. The frame-shaped metallization section may extend in the first metallization plane and/or in a metallization plane located above or below the first metallization plane.

The use of a frame integrated in the circuit board is of advantage in particular for a circuit board arrangement according to the second aspect of the present invention, since the radiator as well as the reflector plane as well as a reflector frame are thus integrated in the circuit board.

Preferably, the vias, which define the frame, extend in this case from the second metallization plane of the reflector to the first metallization plane of the radiator. Preferably, the vias are connected, in particular galvanically connected, to a ground plane of the circuit board formed in the second metallization plane.

According to the present invention, the radiator or the radiators, which are formed by a metallization plane of the circuit board, may be configured as dipole radiators and/or as dipole slot radiators. If the radiator is configured as a dipole radiator, the metallization may define two dipole arms extending outwards from a center. In the area of the center of such a dipole, the two dipole arms are preferably each connected to a respective conductor path of the coplanar stripline.

If the radiator is configured as a dipole slot radiator, the two dipole arms may be arranged in a cutout in a metallization plane of the circuit board.

The radiator according to the present invention or the radiators according to the present invention is/are preferably configured as differential radiators. In particular, the two dipole arms of a dipole radiator and/or of a dipole slot radiator are here each connected to a respective conductor path of a coplanar stripline.

According to a possible embodiment, a plurality of radiators according to the present invention may be arranged on the circuit board in the form of an array. In particular, a plurality of radiator pairs or radiator blocks, which are supplied in parallel with signals via a respective field converter according to the present invention, may be arranged on a circuit board. The radiators may be arranged in rows and/or slots.

In a possible embodiment, the individual radiators and/or radiator pairs of such an array are adapted to be supplied with signals separately. In this case, the signal lines may be integrated in the circuit board arrangement, in particular in the circuit board according to the present invention.

According to a preferred embodiment, the individual radiators and/or radiator pairs of such an array are adapted to be supplied with signals via a common signal line. In this case, the signal line and/or the power dividers for parallel connection of the radiators to the signal line may be integrated in the circuit board.

Furthermore, the antenna defined by a circuit board arrangement according to the present invention may be an active antenna. Preferably, at least one active component, in particular an amplifier, is here arranged on the circuit board according to the present invention and/or integrated in the circuit board according to the present invention.

Preferably, the radiator or the radiators of the circuit board arrangement according to the present invention have a lowermost resonant frequency range and/or a center frequency of a lowermost resonant frequency range, which is in a frequency range between 3 GHz and 300 GHz. Preferably, the resonant frequency range and/or the center frequency of the lowermost resonant frequency range lies in a frequency range between 20 GHz and 60 GHz. In this frequency range, especially also the embodiment according to the second aspect will be particularly advantageous, since the demanded distance of approx. $\lambda/4$ or $\lambda/2$ between the metallization planes can be accomplished by comparatively normal layer thicknesses of a circuit board in this frequency range.

The circuit board arrangement according to the present invention may comprise exclusively the circuit board according to the present invention, or additional components.

The present invention further comprises a mobile radio device including a circuit board arrangement of the type described above. The mobile radio device may be a mobile radio base station. In this case, the circuit board arrangement according to the present invention will preferably be configured as a radiator array, i.e. the circuit board has arranged thereon a plurality of radiators and/or radiator pairs in the form of an array.

The mobile radio device may, however, also be a mobile radio repeater and/or a mobile radio terminal, in particular a mobile phone. Due to the small dimensions of the circuit board arrangement according to the present invention, the latter will also be suitable for use as an antenna for mobile radio repeaters and/or mobile radio terminals.

The present invention will now be described in more detail on the basis of embodiments as well as drawings.

BRIEF DESCRIPTION OF THE FIGURES

FIG. 1A shows a first embodiment of a coplanar stripline according to the present invention.

FIG. 1B shows a second embodiment of a coplanar stripline according to the present invention.

FIG. 2 shows an embodiment of a circuit board according to the present invention, which comprises a field converter having connected thereto a single coplanar stripline.

FIG. 3 shows two variants of a circuit board arrangement, in the case of which the field converter shown in FIG. 2 is connected to a radiator in different ways.

FIG. 6A shows a first variant of coupling a coaxial line section to the coplanar conversion section of the field converter.

FIG. 6B shows a second variant of coupling a coaxial line section to a coplanar conversion section.

FIG. 7 shows a second embodiment of a circuit board according to the present invention comprising a field converter, which also serves as a power divider, the field converter converting the coaxial field into two opposite-phase coplanar stripline fields, FIG. 8A shows how the first embodiment of a field converter serving as a power divider and shown in FIG. 4 is connected to two radiators.

FIG. 8B shows how the second embodiment of a field converter serving as a power divider and shown in FIG. 7 is connected to two radiators.

FIG. 9 shows a plurality of variants of arranging and configuring the radiators, with the type of connection shown in FIG. 8a.

DETAILED DESCRIPTION

Figure 4:
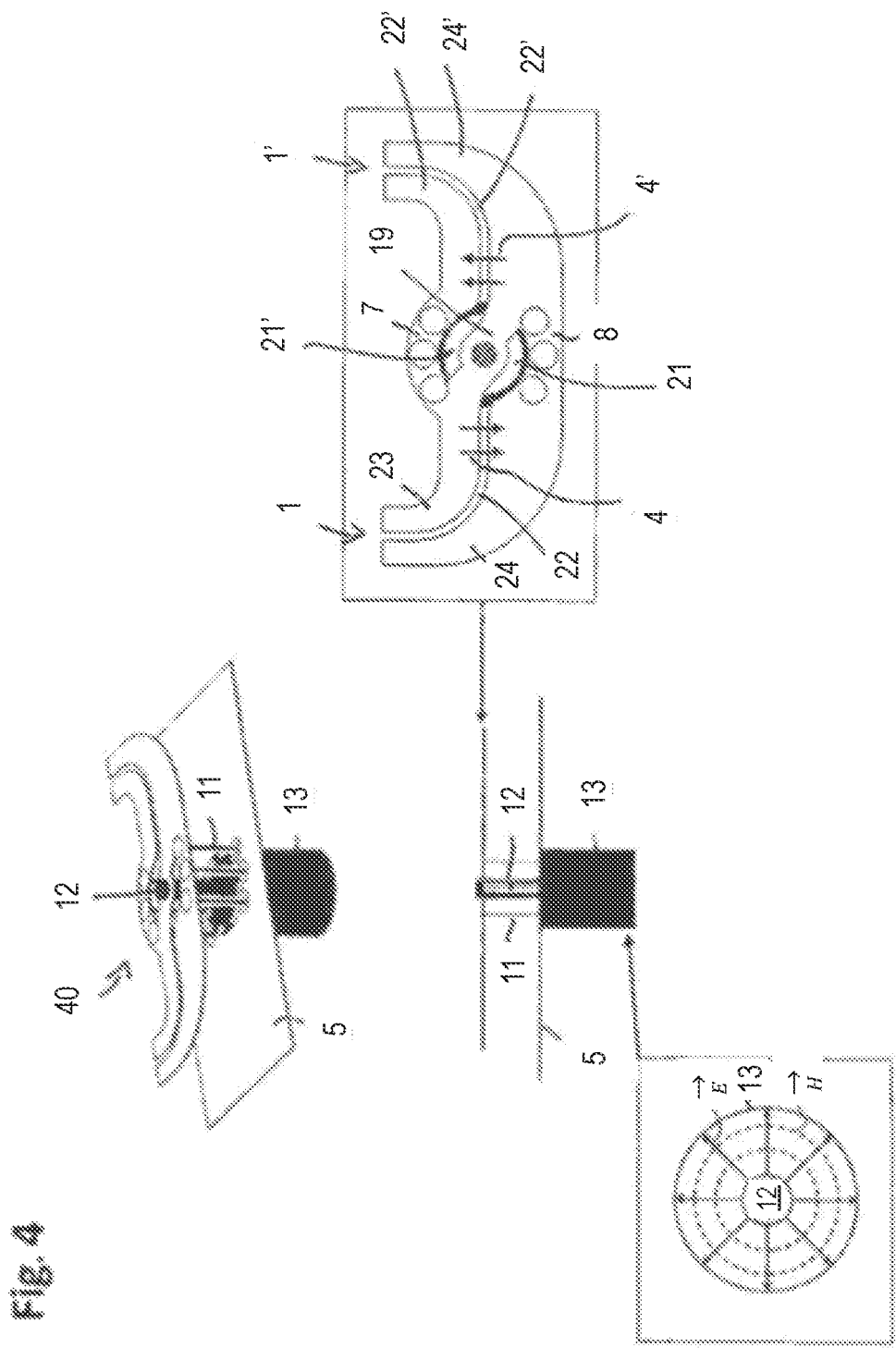
FIG. 4 shows a first embodiment of a circuit board according to the present invention comprising a field converter, which also serves as a power divider for electrically connecting two radiators, the field converter converting the coaxial field into two opposite-phase coplanar stripline fields.

Within the scope of the present invention, a coplanar stripline for supplying signals to a radiator is used for a circuit board arrangement according to the first aspect. FIGS. 1A and 1B show two embodiments of such a coplanar stripline.

The coplanar stripline 1 comprises in both embodiments two conductor paths 23 and 24 arranged on a dielectric substrate 2 of the circuit board and extending at a certain distance from one another. One conductor path is separated from the other only by a slot 22. Both conductor paths are located in the same plane, i.e. they are formed in the same metallization plane of the circuit board. In FIGS. 1A and 1B, the E-field and the H-field of such a coplanar stripline are shown. The E-field extends from one conductor path 23 to the other conductor path 24. The H-field surrounds a respective one of the conductor paths 23 or 24 through the slot 22.

Other than in the case of a microstripline, a coplanar stripline does not require a ground plane opposite the conductor paths 23 and 24. FIG. 1A therefore shows an embodiment in which no ground plane is located opposite the two conductor paths 23 and 24 via the dielectric 2. However, such a ground plane may also be provided. FIG. 1B shows such an embodiment, in which the ground plane 5 is located opposite the two conductor paths 23 and 24 via the dielectric 2. Such embodiments are sometimes also referred to as quasi-coplanar striplines, and also represent coplanar striplines within the meaning of the present invention.

In FIG. 2, a first embodiment of a circuit board arrangement according to the present invention in accordance with the first aspect of the present invention is now shown. FIG. 2 only shows the metallic parts of a field converter according to the present invention, whereas the dielectric substrate provided between the metallization planes of the circuit board is not shown for the sake of clarity.

The field converter shown in FIG. 2 is here connected to a coplanar stripline 1, which is shown in a shortened form in FIG. 2, and conducts a coaxial field through the substrate of the circuit board and converts it into the coplanar stripline field of the coplanar stripline 1.

For this purpose, the field converter comprises a coaxial line section which extends through the substrate from a lower surface of the substrate to the upper surface thereof. In addition, the field converter comprises a coplanar conversion section defined by the metallization sections of the circuit board and connected to the coplanar stripline.

In the embodiment, the outer conductor of the coaxial line section is defined by vias 11, i.e. by electrically conductive through-connections that extend through the substrate of the circuit board and surround an inner conductor 12 in the form of a ring. In the present embodiment, this inner conductor 12 is defined by the inner conductor of a coaxial cable, which is connected to the circuit board in the area of the field converter. Alternatively, also the inner conductor may be formed by a via.

The coplanar conversion section comprises two outer conductor sections 7 and 8, which extend in the area of the outer conductor of the coaxial line section and are in electrical contact therewith. In the embodiment shown in FIG. 2, the two outer conductor sections 7 and 8 are connected to one another at one end, in area 9. The respective other end of the two conductor sections 7 and 8 is connected to the two conductor paths 23 and 24 of the coplanar stripline. The slot 22 arranged between the conductor paths of the coplanar stripline extends into the area of the coplanar conversion section, where it extends between one of the outer conductor sections and the inner conductor 12 as slot 21. In the present embodiment, the width of the slot 21 exceeds that of the slot 22 between the two conductor paths of the coplanar stripline 1.

The slot 21 does not extend around the entire inner conductor 12, but is delimited by an end face 10 connecting the outer conductor section 7 to the inner conductor 12.

In this way, the coaxial field, which the axial conductor section conducts perpendicularly through the circuit board, is blocked in a circumferential subarea and is thus converted into the coplanar stripline field, which is fed to the coplanar stripline extending along the plane of the circuit board.

FIG. 2 shows in a first diagram 16 the coaxial field extending between the inner conductor 12 and the outer conductor 13 of the coaxial line section, and in a second diagram 17 the field, which is partially blocked by the end face 10 and which remains in the slot 21 on the plane of the coplanar conversion section.

In the embodiment shown in FIG. 2, the field converter also serves as connection of a coaxial cable to the circuit board. The coaxial cable comprises an outer conductor 13 and an inner conductor 12. In the present embodiment, the inner conductor 12 extends through a hole in the substrate of the circuit board up to and onto the plane of the coplanar conversion section and, in the embodiment shown, it is in contact with the end face 10. Contacting is effected galvanically in the present embodiment.

The outer conductor 13 of the coaxial cable, however, ends in the area of the lower surface of the circuit board and is extended by the vias 11, which extend through the substrate of the circuit board. The vias are connected to the outer conductor 13 of the coaxial cable on one side thereof and are in contact with the coplanar conversion section on the other side thereof. In particular, the vias are in contact with the two outer conductor sections 7 and 8 of the coplanar conversion section.

In the embodiment shown, the circuit board has on its lower surface a continuous metallization layer 5, which serves as a ground plane. Hence, the coplanar stripline of the embodiment according to FIG. 2 is configured as shown in FIG. 1B. The metallization layer 5 is here electrically connected to the outer conductor 13 of the coaxial cable in area 14 and to the vias 11 in area 15.

In FIG. 3, two embodiments of a circuit board arrangement comprising a field converter 6 according to the embodiment in FIG. 2 are now shown, the coplanar stripline 1 supplying a respective radiator 20 and 20' with signals. Depending on the routing of the coplanar stripline, the polarity of the respective radiator 20 and 20' relative to the orientation of the coplanar conversion section can be selected freely.

The antenna is not specified in detail in FIG. 3. Optionally, a radiator separate from the circuit board could be used, which is only fed by the circuit board arrangement according to the present invention and which is e.g. attached to the circuit board. Preferably, the radiator is, however, defined by a metallization of the circuit board and extends preferably in the same metallization plane as the coplanar stripline 1. The radiator used is here preferably a symmetrically fed differential radiator.

In the embodiment shown in FIG. 2, the field converter has, on the one hand, the function of conducting the coaxial field through the circuit board onto the plane of the metallization, where the coplanar stripline is arranged. Furthermore, the field converter serves to connect a coaxial cable, which is perpendicularly connected to the circuit board and is extended through the circuit board by the coaxial line section of the field converter.

As will be explained in more detail hereinafter, the second function, viz. the connection of a coaxial cable, may also be dispensed with, and the coaxial line section may be used for conducting signals between different planes of a multi-layer circuit board.

Alternatively or additionally to these functions, the field converter may also be used as a power divider. FIG. 4 shows a first embodiment of such a field converter according to the present invention, which is also used as a power divider for feeding two radiators. The two radiators, in turn, are not shown in FIG. 4, but they are supplied with signals by the coplanar stripline 1 and 1' and are connected in parallel to the field converter.

The field converter in FIG. 4 operates according to the same basic principle, which has already been described hereinbefore with respect to the embodiment according to FIG. 2.

The field converter comprises a coaxial line section, which conducts the coaxial field through a layer of the circuit board to a coplanar conversion section. The coaxial line section comprises a plurality of vias 11 defining the outer conductor of the coaxial line section and surrounding an inner conductor 12 of the coaxial line section. The coplanar conversion section comprises two outer conductor sections 7 and 8, which extend in the area of the outer conductor of the coaxial line section and are in electrical contact therewith.

In the embodiment shown in FIG. 4, the outer conductor section 8 merges into the first conductor path 24 of the first coplanar stripline 1, and the second outer conductor section 7 merges into the opposite second conductor path 23' of the second coplanar stripline 1'. The second conductor path 23 of the first coplanar stripline 1, however, is connected to the opposite first conductor path 24' of the second coplanar stripline 1' via a diagonal path 19 of the coplanar conversion section. The diagonal path 19 extends radially to the coaxial line section and is connected to the inner conductor 12.

The field converter thus forms a power divider, which converts the coaxial field into two opposite-phase coplanar line fields 4 and 4' and supplies them to the first and second coplanar striplines 1 and 1'.

The slot 22 between the two conductor paths 23 and 24 of the first coplanar stripline 1 as well as the slot 22' between the two stripline conductor paths 23' and 24' of the second coplanar stripline 1' are each extended into the area between the outer conductor and the inner conductor of the coaxial line section thus forming a slot 21 and 21', respectively. The slots 21 and 21' end at the diagonal path 19. The diagonal path 19 thus divides the coaxial field into two field components, which are supplied to the two coplanar striplines.

In the second embodiment shown in FIG. 4, the diagonal path 19 has the same function as the end face 10 in the embodiment shown in FIG. 2, but is now also interrupted from the opposite side by the slot 21' which extends the slot 22' between the two conductor paths 23' and 24' of the second coplanar stripline 1.

The structural design of the conversion section is here preferably point symmetrical to the inner conductor 12 of the coaxial line section so as to convert the coaxial field into two coplanar stripline fields which are identical except for the phase orientation.

In the embodiment shown in FIG. 4, the outer conductor of the coaxial line section is again defined by vias 11 connecting a metallization plane 5 on the lower surface of the substrate to the outer conductor sections 7 and 8 of the coplanar conversion section, the outer conductor sections 7 and 8 being arranged on the upper surface. The inner conductor is again defined by the inner conductor 12 of a coaxial cable connected to the circuit board in the area of the field converter. The outer conductor 13 of the coaxial cable is again connected, especially via the metallization plane 5, to the outer conductor defined by the vias 11.

The structural design corresponds here to the embodiment that has already been described with respect to FIG. 2. However, as has already been pointed out there, also an alternative structural design is imaginable, in the case of which also the inner conductor 12 of the coaxial line section is defined by a via, and the coaxial line section is used for signal transmission between different planes of a multilayer circuit board.

Figure 5:
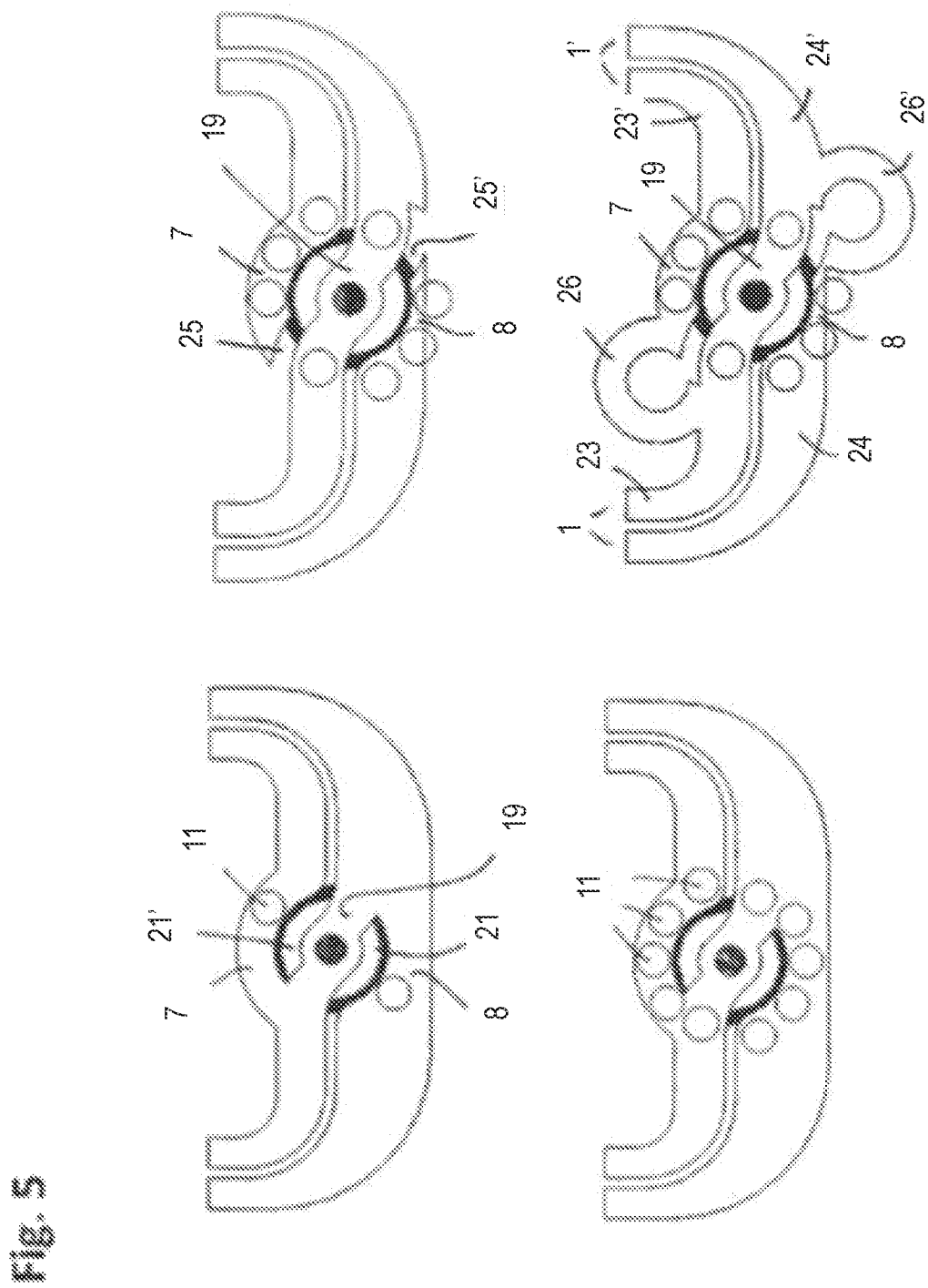
FIG. 5 shows variants of the embodiment shown in FIG. 4.

FIG. 5 shows a plurality of variants of the embodiment shown in FIG. 4. The variants differ from one another, on the one hand with respect to the number of vias 11 defining the outer conductor of the coaxial line section. In the embodiment at the upper left, only one respective via 11 is provided in the area of the two outer conductor sections 7 and 8. In the other embodiments, however, a plurality of vias is provided for each of the two outer conductor sections 7 and 8. Furthermore, a respective via is also provided in the area of the diagonal path on either side. The vias 11 may, in addition, also extend up to and into the area of the coplanar striplines.

In the embodiment at the upper left, the two outer conductor sections 7 and 8 are each galvanically connected to the diagonal path 19. In the embodiment at the upper right, the two outer conductor sections are, however, capacitively connected to the diagonal path 19 via a slot 25 and 25'.

In the embodiment at the lower right, additional compensation surfaces 26 and 26' are provided, via which the outer conductor paths are connected to the diagonal path.

FIGS. 6A and 6B now show two embodiments illustrating how the vias 11 and 11' are electrically contacted with the metallization sections that define the coplanar conversion section. In the embodiment shown in FIG. 6A, contacting is effected galvanically. In the embodiment shown in FIG. 6B, however, contacting between the vias 11' and the metallization sections arranged in the conducting plane 30 is effected capacitively. To this end, the vias 11' end below the metallization plane 30 and are arranged in opposed relationship with the latter with a gap 27 being formed therebetween. Also the inner conductor 12 may be coupled to the coplanar conversion section either galvanically or capacitively.

In an embodiment, which is not shown, the outer conductor of the coaxial cable could be routed through a hole in the substrate of the circuit board and form the outer conductor of the coaxial line section. The outer conductor may e.g. capacitively couple to the outer conductor sections of the coplanar conversion section by ending below the metallization plane 30. This can be accomplished e.g. by a suitable blind hole in the substrate, or by configuring the substrate such that it is composed of two plates, which are arranged one on top of the other and only one of which is provided with the hole for the outer conductor. In this kind of embodiment, vias for the coaxial line section may also be dispensed with completely.

FIG. 7 shows a second embodiment of a field converter 40' according to the present invention, which simultaneously serves as a power divider for supplying two radiators. The general structural design of the field converter and power divider 40' corresponds here to the first embodiment 40 of such a field converter and power divider that has already been described with respect to FIG. 4.

The embodiment shown in FIG. 7, however, converts the coaxial field supplied via the coaxial line section into two in-phase coplanar stripline fields. To this end, the two outer conductor sections 7 and 8 of the embodiment shown in FIG. 7 merge on both sides into a respective conductor path of a coplanar stripline. More concretely, the first conductor path 24 of the first coplanar stripline 1 merges into the outer conductor section 8, which, on the other side, merges into the first conductor path 24' of the second coplanar stripline 1'. The opposite conductor path 23 of the first coplanar stripline 1 merges into the outer conductor section 7 and the latter merges into the first conductor path 23' of the second coplanar stripline 1'. The slots 22 and 22' between the respective conductor paths of the coplanar striplines merge into a common annular gap 21" provided in the area between the inner conductor 12 and the outer conductor of the coaxial line section.

In the embodiment shown in FIG. 7, the inner conductor 12 is therefore only extended onto the plane of the metallization sections defining the coplanar conversion section, but not electrically connected to these metallization sections.

FIGS. 8A and 8B now show the connection of two radiators 20 and 20' to the embodiments of a power divider 40 and 40', respectively, shown in FIGS. 4 and 7.

FIG. 8A shows the connection of the radiators 20 and 20' to the coplanar striplines 1 and 1' of the power divider shown in FIG. 4, in the case of which the coplanar stripline fields 4 and 4' are in phase opposition. In order to be able to operate the two radiators 20 and 20' nevertheless in phase, matching circuits 31 and 31' are arranged between the radiators 20 and 20' and the power divider 40. The matching circuits 31 and 31' may here simply be defined by a suitable routing of the coplanar striplines. In particular, the two coplanar lines have different changes of direction so as to establish the matching circuits 31 and 31'.

In particular, the field in the area of the matching circuit 31 may be rotated by 90° to the right by the first coplanar line 1, while the second coplanar stripline 1' may rotate the field in the area of the matching circuit 31' by 90° to the left. This principle shown in FIG. 8A allows the two radiators 20 and 20' to be arranged side by side relatively close to each other.

In the embodiment shown in FIG. 8b, however, a power divider according to the embodiment in FIG. 7 is shown, in the case of which two in-phase coplanar stripline fields 4 and 4' are generated. The two matching circuits 32 and 32', which are arranged between the radiators 20 and 20' and the power divider 40', therefore change the orientation of the field identically and, in particular, not at all. The antennas 20 and 20' can thus be operated in phase through the in-phase fields.

Figure 9:
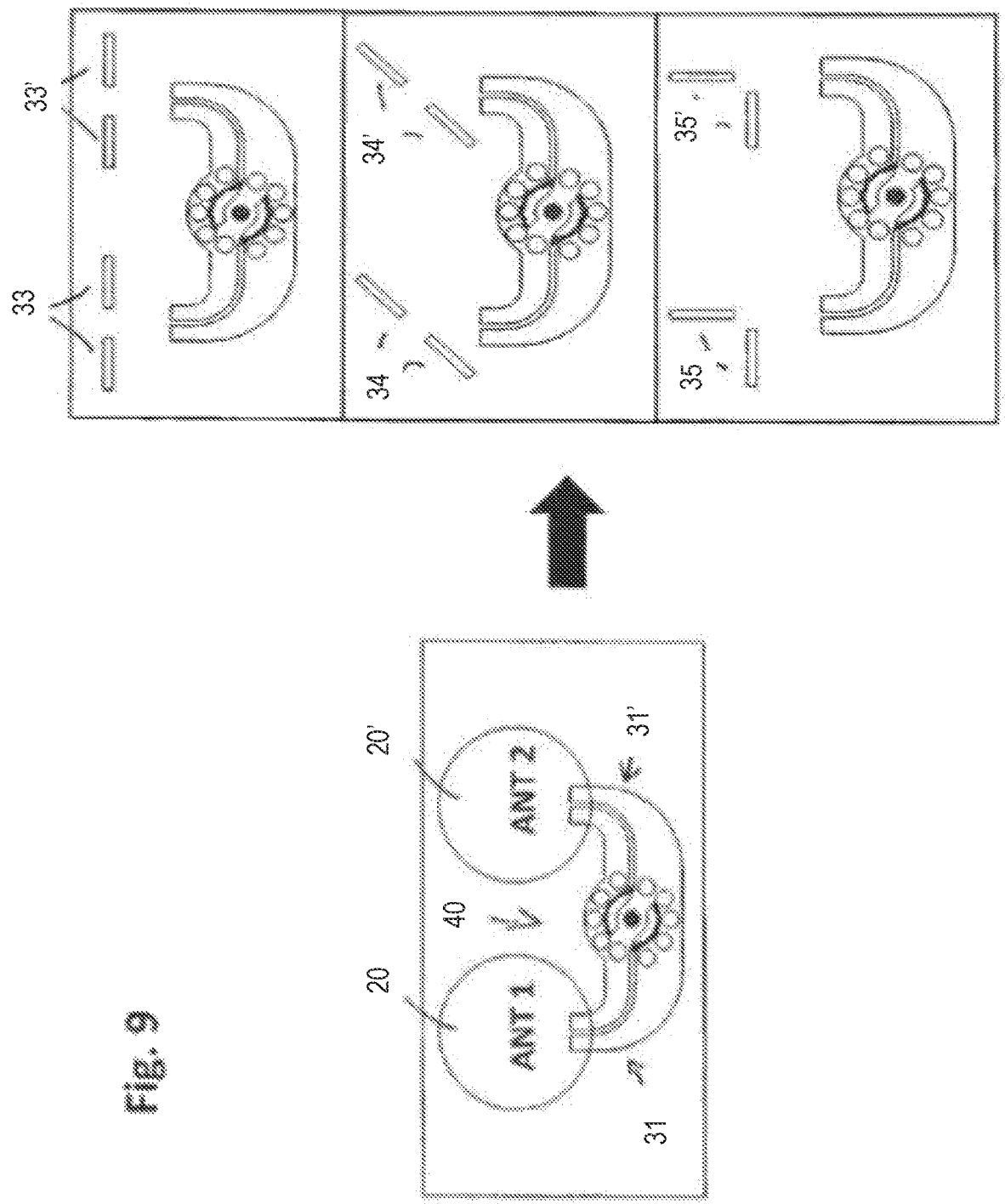

FIG. 9 exemplarily shows once more, on the right hand side, three arrangements of dipole halves of exemplarily applicable dipoles in the embodiment according to FIG. 8A, in which two radiators 20 and 20' are connected to the field converter via the matching circuits 31 and 31', which are here defined by opposite direction changes of the coplanar striplines.

In the uppermost picture on the right, two radiators 33 and 33' are shown, which can be used as a V-pole or as an H-pole. In the middle embodiment, two radiators 34 and 34' are shown, which can be used as a +45° pole or as a −45° pole. In the lower embodiment, an arrangement of two radiators 35 and 35' is shown, which can again be used as a +45° pole or as a −45° pole. The respective dipole halves of dipole radiators are only shown schematically, without showing the concrete connection to the coplanar striplines.

A feature which these embodiments have in common is that the orientation of the two antennas, which are operated in parallel via the power divider, is identical. In particular, they have the same polarization plane.

Figure 10:
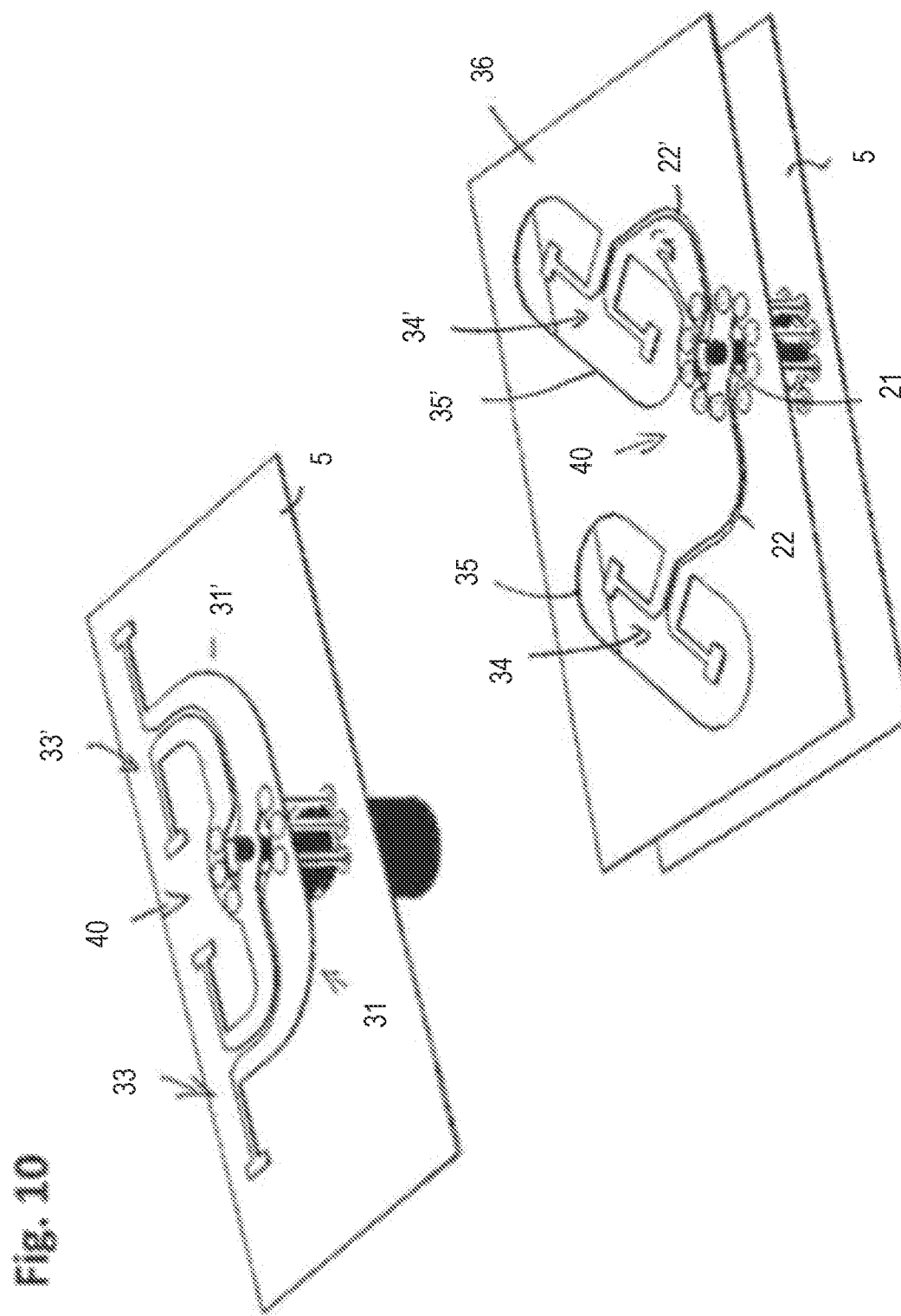
FIG. 10 shows two embodiments of a circuit board arrangement according to the present invention, in which a field converter according to the first aspect as well as a reflector, which is defined by a metallization, according to the second aspect of the present invention are realized.

FIG. 10 shows an embodiment of a circuit board arrangement, in which the first as well as the second aspect of the present invention are realized. According to the first aspect, a field converter 40 is used, which feeds two radiators via coplanar striplines. Furthermore, according to the second aspect, the metallization plane 5 on the lower surface of the substrate of the circuit board serves as a reflector for the radiators 33 and 33' or 34 and 34' formed by the metallization plane arranged on the upper surface of the substrate.

In the embodiment shown in FIG. 10 above, two dipole radiators 33 and 33' are used, which are each supplied with signals from the field converter 40 via the coplanar striplines operating as matching circuits 31 and 31'.

In the embodiment shown in FIG. 10 below, however, two dipole slot radiators 34 and 34' are provided, which are also supplied with signals from the field converter 40 via coplanar striplines. The two conductor paths of the coplanar striplines, however, merge here into a respective continuous metallization surface, so that only the slots 22 and 22' of the coplanar striplines are visible. Also the elements of the coplanar conversion section of the field converter merge into the continuous metallization surface, so that also in this case only the slots 21 and 21' remain.

The two dipole elements of the dipole radiators 34 and 34' extend here in an opening 35 of the metallization, so that respective slot sections are formed between the dipole elements and the metallization.

In the embodiment shown in FIG. 10 above, the two radiators extend in a common polarization plane. The latter is offset relative to the field converter 40 and the stripline sections directly adjoining the field converter 40.

In the embodiment shown in FIG. 10 below, the radiators, however, extend in respective parallel polarization planes which are, however, offset relative to one another. The centers of the two radiators are, however, again arranged in a plane, which is offset relative to the field converter 40 and the coplanar stripline sections directly adjoining the latter.

In the embodiments shown in FIG. 10, the metallization plane 5 on the lower surface of the substrate of the circuit board serves as a reflector for the radiators 33 and 33' or 34 and 34'. For this purpose, the thickness of the substrate between the metallization plane 5 and the metallization plane of the radiators is preferably approx. $\lambda/4$, with $\lambda$ being the wavelength in the dielectric of the substrate of the center frequency of the lowermost resonant frequency range of the antenna. It follows that, according to the present invention, a directional radiation of the radiators will only occur towards one side, perpendicular to the plane of the circuit board. The metallization 5, which forms the reflector, therefore extends in the plane below the radiators 33 and 33', respectively, and forms a ground plane.

In the embodiments shown in FIG. 10, the multilayer circuit board comprises only two metallization planes and an intermediate substrate layer.

It goes without saying that an arrangement of the type in question is also imaginable for a multilayer circuit board comprising more than two metallization planes, so that e.g. the metallization plane defining the reflector or the metallization plane in which the radiator or the radiators are formed represents an inner metallization plane of the circuit board.

In addition, the integrated reflector according to the second aspect may also be used independently of the use of the first aspect, i.e. the field converter 40 may also be dispensed with.

Figure 11:
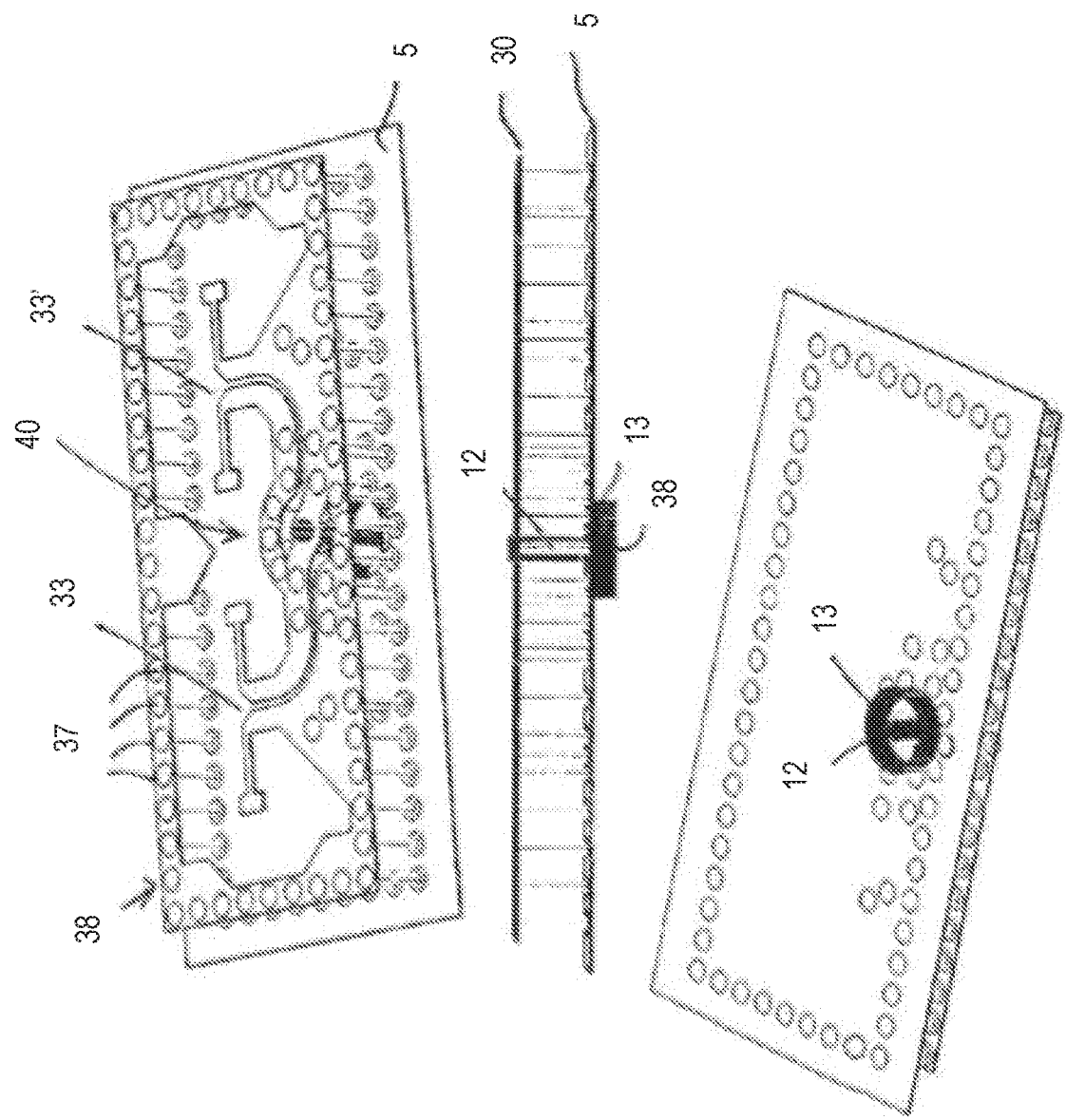
FIG. 11 shows a further embodiment, in which the first and the second aspect are realized, the field converter being also used for connecting a coaxial cable.

FIG. 11 shows a further concrete embodiment of a circuit board antenna realizing both the first and the second aspect. The structural design of the radiators and of the reflector corresponds to the embodiment shown in FIG. 10 above. In addition, however, a frame 38 of vias 37 is provided here. The vias 37 extend from the reflector plane 5 to the plane of metallization in which the radiators are formed. In addition, the vias 37 are connected by a frame-shaped metallization section in this plane. Alternatively, the frame 38 of vias 37 may end in some other plane below or above the metallization plane in which the radiators are formed and/or begin in some other plane below or above the reflector plane 5. Alternatively or additionally, the frame-shaped metallization section could be arranged in a metallization plane other than the metallization plane in which the radiators are formed, in particular in a metallization plane located above and/or at a short distance from the metallization plane in which the radiators are formed. The vias 37 and the frame-shaped metallization section also influence the antenna pattern and the S-parameters and can therefore be used e.g. for shaping the far field.

In the embodiment shown in FIG. 11, the field converter 40 is again used to connect a coaxial cable. To this end, the inner conductor of the coaxial line section 12 is configured as a hollow rod into which the inner conductor of a coaxial cable can be inserted. In addition, a bushing 13 is provided, which is adapted to be contacted with the outer conductor of a coaxial cable. Such contacting is also possible in the case of the other embodiments of the present invention.

Figure 12:
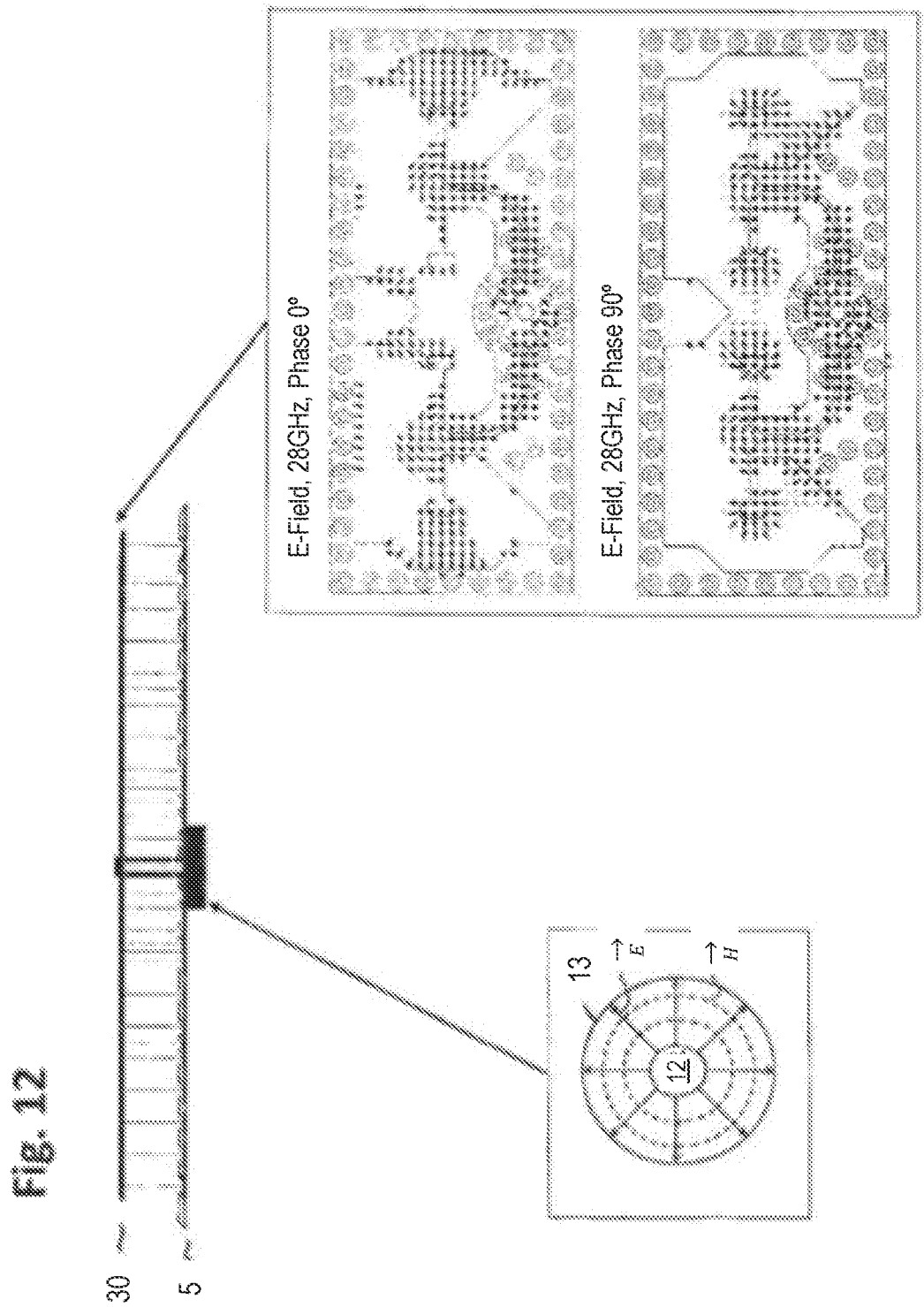
FIG. 12 shows a representation of the embodiment shown in FIG. 11, with a plurality of diagrams showing the E-field distribution.

FIG. 12 shows the embodiment shown in FIG. 11 with the E-field distribution in the area of the coaxial line section as well as in the area of the coplanar conversion section of the field converter. The box at the bottom left shows the coaxial field supplied via the coaxial cable. The box on the right shows the respective E-field of the coplanar conversion section at phase 0° and 90°. The conversion from the radial coaxial field into the coplanar stripline fields caused by the coplanar conversion section is clearly visible.

Figure 13:
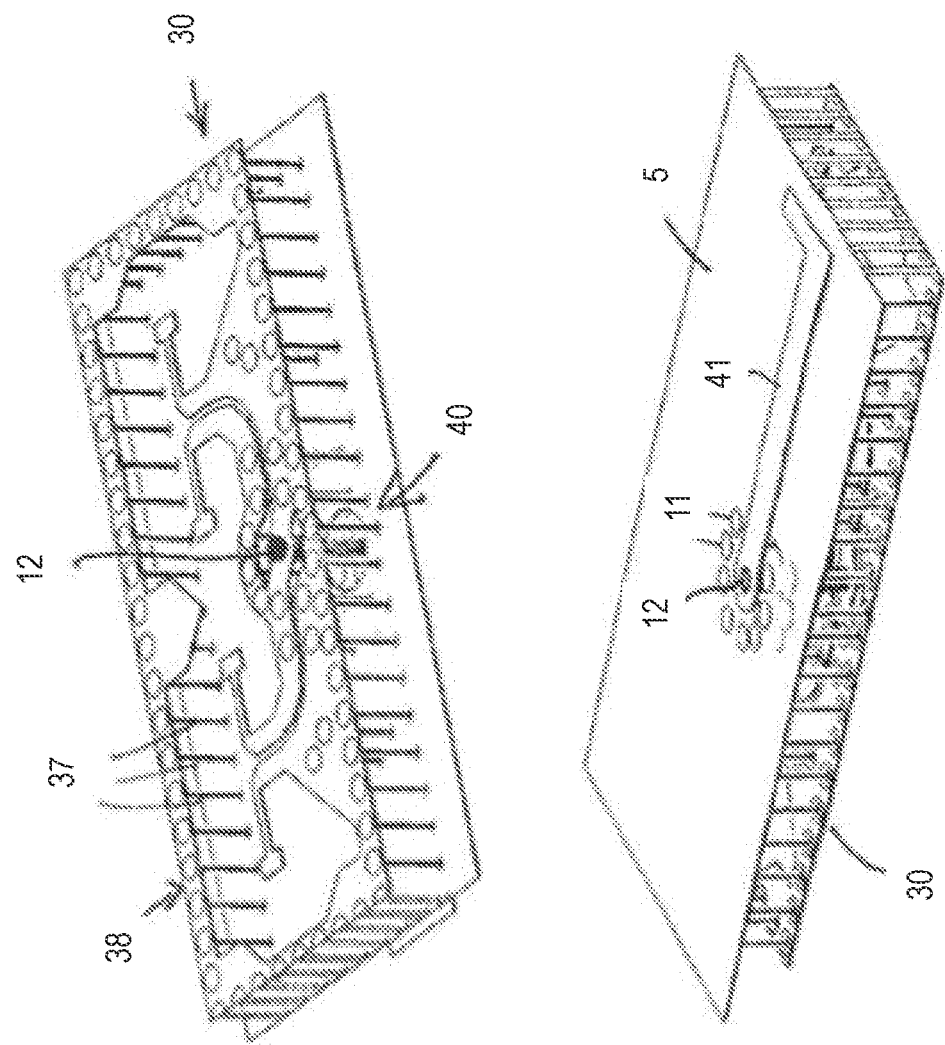
FIG. 13 shows an embodiment in which the first and the second aspect are realized, the field converter being used for internal signal transmission between different planes of the circuit board.

FIG. 13 shows a further embodiment of a circuit board arrangement in which both aspects of the present invention are realized in combination. As regards the radiators, the frames and the field converters, the embodiment corresponds to the embodiment in FIG. 11.

In the embodiment shown in FIG. 13, the field converter, however, serves to transmit signals within the circuit board, i.e. from a first plane of the circuit board to a second or third plane of the circuit board. In particular, a stripline 41 is arranged in a metallization plane 45 of the circuit board, the field converter conducting the signals through at least one layer of the circuit board to the metallization plane 30 in which the radiators are arranged.

In the present embodiment, the metallization plane 5 serving as a reflector is provided between these two metallization planes. This allows the stripline 41 to be routed in the metallization plane 45 of the circuit board independently of the position of the radiators in the metallization plane 30.

In the present embodiment, both the inner conductor and the outer conductor of the coaxial line section of the field converter 40 are formed by vias 11. The vias 11 extend here from the metallization plane 45 of the stripline 41 to the intermediate metallization plane 5 and from there to the metallization plane 30 of the radiators.

In the present embodiment, the stripline 41 is configured as a microstripline and coupled to the inner conductor 12 of the coaxial line section. The metallization plane 5 also serves as a ground plane for the microstripline 41. The vias 11 surround the inner conductor in a semi-circle so that the stripline 41 can be routed out of the area of the outer conductor on the open side.

Alternatively, a coplanar stripline may also be used in the metallization plane 45 so as to conduct the signals to the field converter. In this case, a coplanar conversion section of the type shown e.g. in FIG. 2 could be used in the metallization plane 45.

The structure shown in FIG. 13 requires three metallization planes of the multilayer circuit board between which dielectric substrate layers are arranged. As shown in the present embodiment, the substrate layers may have different thicknesses. In particular, the substrate layer on the side of the ground plane 5 facing away from the radiators may be thinner than the substrate layer on the side facing the radiators, through which the distance between the radiators and the reflector is defined.

Furthermore, arrangements in which an even higher number of metallization planes is provided are imaginable. Alternatively or additionally, a distribution network, matching circuits, electronic components, such as an amplifier, etc., could be provided on the side of the reflector plane 5 which faces away from the radiators and on which also the stripline 41 is provided.

Figure 14:
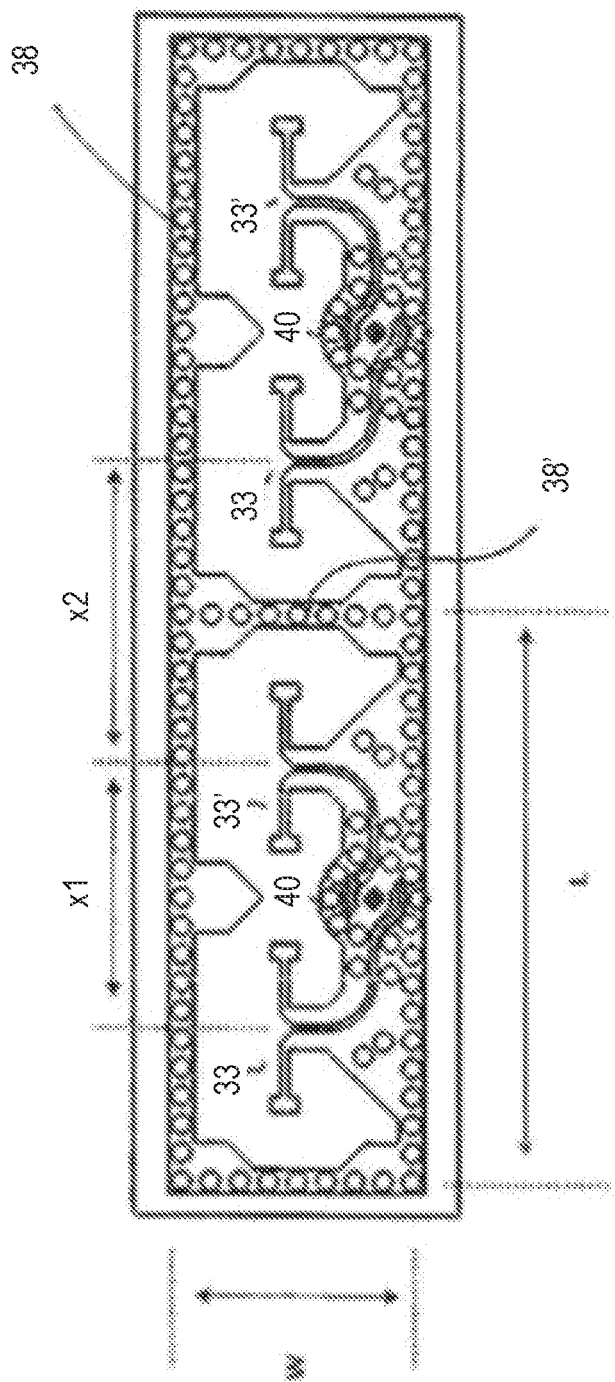
FIG. 14 shows, in a top view, a further embodiment, in which two radiator pairs are integrated in the circuit board as an antenna array.

FIG. 14 shows a further embodiment, which is based on the embodiment shown in FIG. 13 and in which two antenna pairs of the type shown in FIG. 13 are connected side by side so as to form an antenna array. Two pairs of radiators of the type shown in FIG. 13 are here arranged side by side in a row, so that the centers of all the radiators lie on one line. The two pairs of radiators are each surrounded by frames 38, so that a frame line 38' is provided between the two pairs of radiators.

The distance x1 between the two radiators 33 and 33' of a radiator pair, which are supplied in common via a field converter 40 operating as a power divider, is preferably between $0.5\lambda$ and $0.9\lambda$, e.g. $0.7\lambda$. The distance x2 between neighboring radiators of two pairs of radiators is preferably between 0.5 and $0.9\lambda$, e.g. approx. $0.8\lambda$. The width W of the frame perpendicular to the orientation of the row of radiators is between $0.4\lambda$ and $0.8\lambda$, preferably approx. $0.6\lambda$. The length L of the frame in row direction for a radiator pair is between $1.2\lambda$ and $1.8\lambda$, preferably approx. $1.5\lambda$. $\lambda$ is here again the wavelength of the center frequency of the lowermost resonant frequency range of the radiators.

The circuit board arrangement according to the present invention is preferably operated in the range between 3 GHz and 300 GHz, e.g. in a frequency band at 28 GHz. This results in extremely compact dimensions allowing the installation of such an array antenna also in mobile phones. The array antenna may, however, also be used in mobile radio base stations. In this case, the antennas are preferably arranged in rows as well as in columns next to each other.

Figure 15:
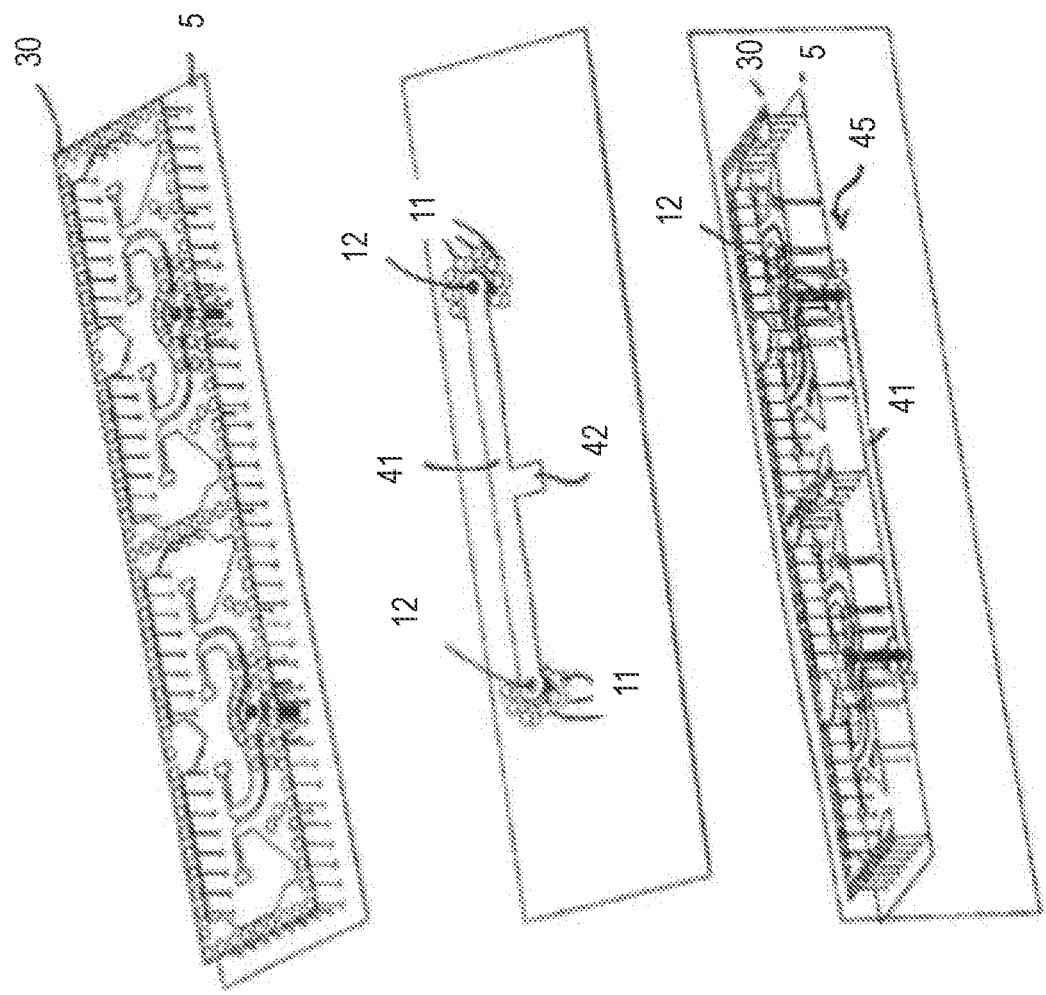
FIG. 15 shows the embodiment shown in FIG. 14, in a perspective view laterally from above, laterally from below and in a sectional view.

FIG. 15 shows the embodiment of an array antenna according to FIG. 14 in a perspective view obliquely from above, obliquely from below and in a sectional view. The striplines 41, which supply the two field converters 40 of the two radiator pairs with signals, are here visible. Furthermore, a supply line 42 is here provided, which merges into the supply lines 41 via a power divider. All the radiators can thus be operated in parallel. Alternatively, it would also be imaginable to supply the individual radiator pairs separately with signals and to provide separate signal lines for this purpose.

Figure 16:
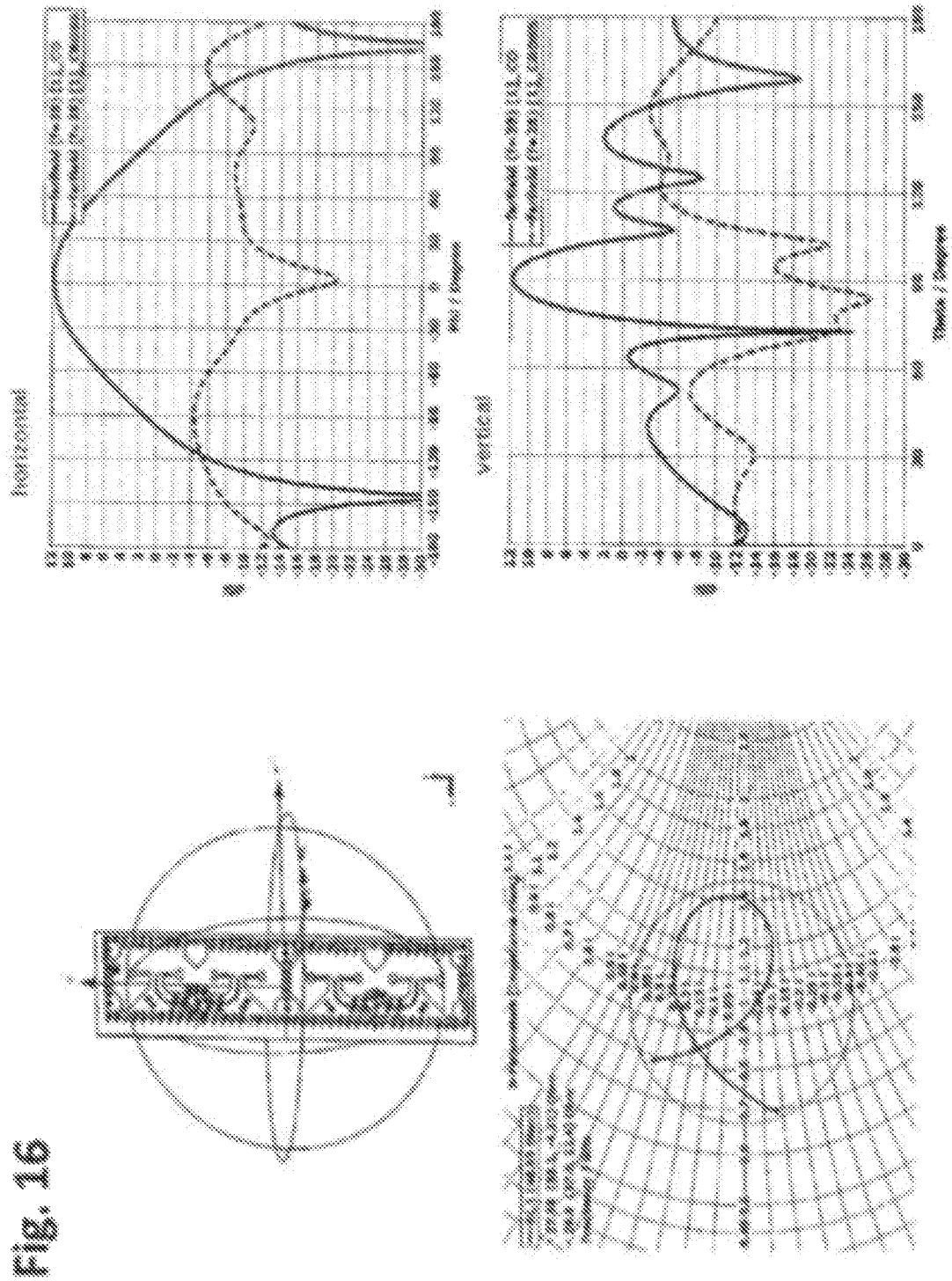
FIG. 16 shows a Smith Chart as well as far field diagrams in a horizontal and in a vertical direction of the embodiment shown in FIGS. 14 and 15.

FIG. 16 now shows on the left the Smith Chart of the antenna array shown in FIGS. 14 and 15, and on the right the far field diagram in a horizontal and in a vertical plane. Due to the fact that the four radiators are arranged as a column antenna, the full width at half maximum of the main lobe in the vertical plane will be smaller than that in the horizontal plane.

Due to the reflector integrated in the circuit board, the radiation is emitted only to one side of the circuit board radiator. The reflector frame integrated in the circuit board serves to shape the far field.

The invention claimed is:

1. A circuit board arrangement comprising a circuit board, whose metallization comprises at least two coplanar striplines comprising at least two conductor paths for electrically connecting and supplying signals to a respective one of two radiators, wherein the circuit board comprises a field converter that defines a power divider for electrically connecting the two radiators to a signal line, the field converter is electrically connected to the at least two coplanar striplines and conducts a coaxial field through at least one layer of the circuit board and converts and divides the coaxial field into a coplanar stripline field of the at least two coplanar striplines.

2. The circuit board arrangement according to claim 1, wherein the two radiators are arranged in parallel and connected to the field converter such that the two radiators radiate in phase,
and/or wherein the field converter converts and divides the coaxial field into two opposite-phase coplanar stripline fields, the at least two coplanar striplines generating an in-phase field at the two radiators,
and/or wherein the field converter converts and divides the coaxial field into two in-phase coplanar stripline fields, and the at least two coplanar striplines generate an in-phase field at the two radiators.

3. The circuit board arrangement according to claim 1, wherein the two radiators are defined by the metallization of the circuit board, wherein the two radiators are arranged in a same plane of the circuit board as the at least two coplanar striplines, and/or wherein the field converter comprises vias and/or metallization sections of the circuit board.

4. The circuit board arrangement according to claim 1, wherein the field converter comprises a coaxial line section that conducts the coaxial field through at least one layer of the circuit board and a coplanar conversion section, wherein the coaxial line section is routed onto a plane of the coplanar conversion section of the field converter and/or is electrically contacted therewith, wherein the coplanar conversion section of the field converter is defined by metallization sections of the circuit board, and/or wherein a plurality of vias is provided, which define an outer conductor of the coaxial line section of the field converter, and/or wherein an inner conductor of the coaxial line section is defined by an inner conductor of a coaxial cable and/or a via.

5. The circuit board arrangement according to claim 4, wherein the coplanar conversion section of the field converter comprises two outer conductor paths connected to the outer conductor of the coaxial line section of the field converter in opposite areas, the two outer conductor paths merging into at least one respective path of a coplanar stripline.

6. The circuit board arrangement according to claim 5, wherein the circuit board has two coplanar striplines to which the coplanar conversion section of the field converter is connected on opposite sides, the outer conductor paths of the field converter merging into at least one path of the respective coplanar stripline,
wherein the coplanar conversion section of the field converter comprises a diagonal path, which diagonally connects opposite paths of the two coplanar striplines and which is connected to the inner conductor of a coaxial line section of the field converter, the outer conductor paths coupling to the diagonal path section on opposite sides capacitively or galvanically, and/or wherein the two outer conductor paths each merge on either side thereof into a path of the respective coplanar striplines, the inner conductor of the coaxial line section of the field converter remaining free.

7. The circuit board arrangement according to claim 5, wherein the circuit board comprises a coplanar stripline connected on one side to the coplanar conversion section of the field converter, wherein the two outer conductor paths merge into a respective path of the coplanar stripline and are connected to one another on the opposite side, wherein the coplanar conversion section of the field converter comprises an end face, which connects one of the outer conductor sections to the inner conductor.

8. The circuit board arrangement according to claim 1, wherein the field converter serves to connect a coaxial cable to the circuit board, wherein the coaxial cable is connected to the circuit board transversely to the plane of the circuit board wherein the coaxial field is conducted to the field converter through a coaxial cable, and/or wherein; the inner conductor of the coaxial cable defines the inner conductor of a coaxial line section of the field converter or is in electrical contact therewith, and/or wherein the outer conductor defines the outer conductor of a coaxial line section of the field converter or is in electrical contact therewith.

9. The circuit board arrangement according to claim 1, wherein the circuit board is a multilayer circuit board, wherein the field converter is used for establishing a signal connection between two planes of the circuit board, and/or wherein the coplanar stripline is arranged in a first metallization plane of the circuit board and the circuit board comprises in a second or third metallization plane a stripline, which is electrically connected to the coplanar stripline via the field converter through at least one layer of the circuit board.

10. The circuit board arrangement according to claim 9, wherein the stripline is a microstripline and/or wherein the field converter comprises a coplanar conversion section in the first metallization plane of the circuit board, a stripline section in the second or third metallization plane of the circuit board, and a coaxial line section connecting the coplanar conversion section through at least one layer of the circuit board to the stripline section, wherein a second metallization plane is provided between the third metallization plane of the coplanar conversion section and the first metallization plane of the stripline section, the second metallization plane being used as a ground plane.

11. The circuit board arrangement according to claim 1, wherein the two radiators are surrounded by a frame, which is defined by vias, and/or wherein the two radiators are configured as dipole radiators and/or as dipole slot radiators, and/or wherein a plurality of radiators are arranged on the circuit board in the form of an array.

12. The circuit board arrangement according to claim 1, wherein the two radiators have a lowermost resonant frequency range and/or a center frequency of a lowermost resonant frequency range, which is in a frequency range between 3 GHz and 300 GHz.

13. The circuit board arrangement according to claim 1, wherein each of the two radiators is a mobile communication radiator.

14. A mobile radio device, a mobile radio repeater, or a mobile radio terminal, comprising a circuit board whose metallization comprises at least two coplanar striplines comprising at least two conductor paths for electrically connecting and supplying signals to a respective one of two radiators, wherein the circuit board comprises a field converter that defines a power divider for electrically connecting the two radiators to a signal line, the field converter is electrically connected to the at least two coplanar striplines and conducts a coaxial field through at least one layer of the circuit board and converts and divides the coaxial field into a coplanar stripline field of the at least two coplanar striplines.

15. The mobile radio device of claim 14, wherein the device is a mobile radio base station.

16. A circuit board arrangement, including a circuit board, whose metallization comprises at least one coplanar stripline comprising at least two conductor paths for supplying signals to a radiator, in at least a first metallization plane, wherein the radiator is supplied by a stripline extending in a third metallization plane of the circuit board, wherein a reflector of the radiator is defined by a second metallization plane of the circuit board, wherein the second metallization plane defining the reflector extends between the third metallization plane defining the stripline and the first metallization plane of the radiator, and/or wherein the radiator and the stripline are electrically connected by means of a field converter through a layer of the circuit board, wherein the field converter conducts a coaxial field through at least one layer of the circuit board, and/or wherein the metallization of the circuit board comprises the at least one coplanar stripline for supplying signals to the radiator.

17. The circuit board arrangement according to claim 16, wherein the second metallization plane extends at a distance of $0.1\lambda$ to $0.7\lambda$ from the first metallization plane.

18. A mobile radio device, a mobile radio repeater, or a mobile radio terminal, comprising a circuit board whose metallization comprises at least one coplanar stripline comprising at least two conductor paths for supplying signals to a radiator, in at least a first metallization plane, wherein the radiator is supplied by a stripline extending in a third metallization plane of the circuit board, wherein a reflector of the radiator is defined by a second metallization plane of the circuit board, wherein the second metallization plane defining the reflector extends between the third metallization plane defining the stripline and the first metallization plane of the radiator, and/or wherein the radiator and the stripline are electrically connected by means of a field converter through a layer of the circuit board, wherein the field converter conducts a coaxial field through at least one layer of the circuit board, and/or wherein the metallization of the circuit board comprises the at least one coplanar stripline for supplying signals to the radiator.

* * * * *